(12) United States Patent
Lu et al.

(10) Patent No.: US 9,502,471 B1
(45) Date of Patent: Nov. 22, 2016

(54) MULTI TIER THREE-DIMENSIONAL MEMORY DEVICES INCLUDING VERTICALLY SHARED BIT LINES

(71) Applicant: SANDISK TECHNOLOGIES INC., Plano, TX (US)

(72) Inventors: Zhenyu Lu, Milpitas, CA (US); Henry Chien, San Jose, CA (US); Johann Alsmeier, San Jose, CA (US); Koji Miyata, Yokkaichi (JP); Tong Zhang, Palo Alto, CA (US); Man Mui, Fremont, CA (US); James Kai, Santa Clara, CA (US); Wenguang Shi, Milpitas, CA (US); Wei Zhao, Milpitas, CA (US); Xiaolong Hu, Yokkaichi (JP); Jiyin Xu, Yokkaichi (JP); Gerrit Jan Hemink, Milpitas, CA (US); Christopher Petti, Mountain View, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/834,943

(22) Filed: Aug. 25, 2015

(51) Int. Cl.
  *H01L 47/00* (2006.01)
  *H01L 27/24* (2006.01)
  (Continued)

(52) U.S. Cl.
  CPC ......... *H01L 27/2481* (2013.01); *H01L 21/768* (2013.01); *H01L 23/528* (2013.01); *H01L 23/5226* (2013.01); *H01L 27/11556* (2013.01); *H01L 27/11582* (2013.01); *H01L 27/2454* (2013.01); *H01L 29/66666* (2013.01); *H01L 29/7883* (2013.01); *H01L 45/124* (2013.01)

(58) Field of Classification Search
  CPC ............. H01L 27/2481; H01L 21/768; H01L 23/5226; H01L 23/528; H01L 27/11556; H01L 27/11582; H01L 29/66666; H01L 29/7883
  See application file for complete search history.

(56) References Cited

U.S. PATENT DOCUMENTS

| 5,387,530 A | 2/1995 | Doyle et al. |
| 5,915,167 A | 6/1999 | Leedy |

(Continued)

FOREIGN PATENT DOCUMENTS

| EP | 1398831 A2 | 3/2004 |
| WO | WO02/15277 A2 | 2/2002 |

(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Yosef Gebreyesus
(74) *Attorney, Agent, or Firm* — The Marbury Law Group PLLC

(57) ABSTRACT

A multi-tier memory device is formed over a substrate such that memory stack structures extend through an alternating stack of insulating layers and electrically conductive layers within each tier. Bit lines are formed between an underlying tier having drain regions over semiconductor channels and an overlying tier having drain regions under semiconductor channel, such that the bit lines are shared between the underlying tier and the overlying tier. Source lines can be formed over each tier in which source regions overlie semiconductor channels and drain regions. If another tier is present above the source lines, the source lines can be shared between two vertically neighboring tiers.

26 Claims, 15 Drawing Sheets

(51) Int. Cl.
*H01L 27/115* (2006.01)
*H01L 23/528* (2006.01)
*H01L 23/522* (2006.01)
*H01L 29/788* (2006.01)
*H01L 45/00* (2006.01)
*H01L 29/66* (2006.01)
*H01L 21/768* (2006.01)

(56) References Cited

U.S. PATENT DOCUMENTS

| | | |
|---|---|---|
| 7,177,191 B2 | 2/2007 | Fasoli et al. |
| 7,221,588 B2 | 5/2007 | Fasoli et al. |
| 7,233,522 B2 | 6/2007 | Chen et al. |
| 7,514,321 B2 | 4/2009 | Mokhlesi et al. |
| 7,575,973 B2 | 8/2009 | Mokhlesi et al. |
| 7,745,265 B2 | 6/2010 | Mokhlesi et al. |
| 7,808,038 B2 | 10/2010 | Mokhlesi et al. |
| 7,848,145 B2 | 12/2010 | Mokhlesi et al. |
| 7,851,851 B2 | 12/2010 | Mokhlesi et al. |
| 8,008,710 B2 | 8/2011 | Fukuzumi et al. |
| 8,053,829 B2 | 11/2011 | Kang et al. |
| 8,187,936 B2 | 5/2012 | Alsmeier et al. |
| 8,193,054 B2 | 6/2012 | Alsmeier |
| 8,198,672 B2 | 6/2012 | Alsmeier |
| 8,349,681 B2 | 1/2013 | Alsmeier et al. |
| 8,394,716 B2 | 3/2013 | Hwang et al. |
| 8,445,347 B2 | 5/2013 | Alsmeier |
| 8,450,181 B2 | 5/2013 | Chen et al. |
| 8,614,126 B1 | 12/2013 | Lee et al. |
| 8,658,499 B2 | 2/2014 | Makala et al. |
| 8,741,761 B2 | 6/2014 | Lee et al. |
| 8,847,302 B2 | 9/2014 | Alsmeier et al. |
| 8,878,278 B2 | 11/2014 | Alsmeier et al. |
| 8,884,357 B2 | 11/2014 | Wang et al. |
| 8,946,023 B2 | 2/2015 | Makala et al. |
| 8,987,089 B1 | 3/2015 | Pachamuthu et al. |
| 2003/0068859 A1* | 4/2003 | Leung ............... H01L 27/115 438/257 |
| 2003/0107092 A1* | 6/2003 | Chevallier ............ G11C 7/18 257/390 |
| 2003/0232472 A1* | 12/2003 | Wu ................ H01L 27/11521 438/257 |
| 2006/0003531 A1 | 1/2006 | Chang et al. |
| 2006/0258076 A1 | 11/2006 | Mizushima et al. |
| 2007/0210338 A1 | 9/2007 | Orlowski |
| 2007/0252201 A1 | 11/2007 | Kito et al. |
| 2008/0067583 A1 | 3/2008 | Kidoh et al. |
| 2008/0169496 A1 | 7/2008 | Keller et al. |
| 2009/0026561 A1 | 1/2009 | Reichenbach et al. |
| 2009/0121271 A1 | 5/2009 | Son et al. |
| 2009/0242967 A1 | 10/2009 | Katsumata et al. |
| 2010/0044778 A1 | 2/2010 | Seol |
| 2010/0059811 A1 | 3/2010 | Sekine et al. |
| 2010/0112769 A1 | 5/2010 | Son et al. |
| 2010/0117143 A1 | 5/2010 | Lee et al. |
| 2010/0120214 A1 | 5/2010 | Park et al. |
| 2010/0155810 A1 | 6/2010 | Kim et al. |
| 2010/0155818 A1 | 6/2010 | Cho |
| 2010/0171162 A1 | 7/2010 | Katsumata et al. |
| 2010/0181610 A1 | 7/2010 | Kim et al. |
| 2010/0207195 A1 | 8/2010 | Fukuzumi et al. |
| 2010/0213458 A1 | 8/2010 | Prall |
| 2010/0320528 A1 | 12/2010 | Jeong et al. |
| 2011/0065270 A1 | 3/2011 | Shim et al. |
| 2011/0076819 A1 | 3/2011 | Kim et al. |
| 2011/0133606 A1 | 6/2011 | Yoshida et al. |
| 2011/0151667 A1 | 6/2011 | Hwang et al. |
| 2011/0169067 A1* | 7/2011 | Ernst ............... H01L 21/8221 257/316 |
| 2011/0266606 A1 | 11/2011 | Park et al. |
| 2011/0287612 A1 | 11/2011 | Lee et al. |
| 2011/0312174 A1 | 12/2011 | Lee et al. |
| 2012/0001247 A1 | 1/2012 | Alsmeier |
| 2012/0001249 A1 | 1/2012 | Alsmeier et al. |
| 2012/0003800 A1 | 1/2012 | Lee et al. |
| 2012/0052674 A1 | 3/2012 | Lee et al. |
| 2012/0068242 A1 | 3/2012 | Shin et al. |
| 2012/0074367 A1 | 3/2012 | Costa et al. |
| 2012/0140562 A1 | 6/2012 | Choe et al. |
| 2012/0153376 A1 | 6/2012 | Alsmeier et al. |
| 2012/0208347 A1 | 8/2012 | Hwang et al. |
| 2012/0256247 A1 | 10/2012 | Alsmeier et al. |
| 2012/0261638 A1 | 10/2012 | Sills et al. |
| 2012/0276719 A1 | 11/2012 | Han et al. |
| 2013/0248974 A1 | 9/2013 | Alsmeier et al. |
| 2013/0264631 A1 | 10/2013 | Alsmeier et al. |
| 2013/0313627 A1 | 11/2013 | Lee et al. |
| 2013/0313717 A1 | 11/2013 | Holmes et al. |
| 2013/0322174 A1 | 12/2013 | Li et al. |
| 2014/0264525 A1 | 9/2014 | Takahashi et al. |
| 2014/0264533 A1 | 9/2014 | Simsek-Ege et al. |
| 2014/0264542 A1 | 9/2014 | Simsek-Ege et al. |
| 2014/0273373 A1 | 9/2014 | Makala et al. |
| 2015/0003158 A1 | 1/2015 | Aritome |

FOREIGN PATENT DOCUMENTS

| | | |
|---|---|---|
| WO | WO2008/118433 A1 | 10/2008 |
| WO | WO2009/085078 A1 | 7/2009 |
| WO | WO2012/003301 A2 | 1/2012 |
| WO | WO2015/126664 A1 | 8/2015 |

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Tanaka et al., "Bit-Cost Scalable Technology for Low-Cost and Ultrahigh-Density Flash Memory," Toshiba Review, vol. 63, No. 2, 2008, pp. 28-31.

Kimura, M. "3D Cells Make Terabit NAND Flash Possible," Nikkei Electronics Asia, Sep. 17, 2009, 6pgs.

International Search Report & Written Opinion, PCT/US2011/042566, Jan. 17, 2012.

Invitation to Pay Additional Fees & Partial International Search Report, PCT/US2011/042566, Sep. 28, 2011.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

Chen et al., "Reliability Characteristics of NiSi Nanocrystals Embedded in Oxide and Nitride Layers for Nonvolatile Memory Application," Applied Physics Letters 92, 152114 (2008).

J. Ooshita, Toshiba Announces 32Gb 3D-Stacked Multi-Level NAND Flash, 3 pages, http://techon.nikkeibp.co.jp/english/NEWS_EN/20090619/171977/ Nikkei Microdevices, Tech-On, Jun. 19, 2009.

Li, W. et al., "Sacrificial Polymers for Nanofluidic Channels in Biological Applications", Nanotechnology 14 (2003) 578-583.

Invitation to Pay Additional Search Fees, International Application No. PCT/US13/24638, issued Apr. 24, 2013.

Non-Final Office for U.S. Appl. No. 13/933,743, Office Action issued Apr. 21, 2014, 29pgs.

Search Report and Written Opinion PCT/US2014/020290, dated Jun. 25, 2014, 10 pages.

Search Report and Written Opinion of PCT/US2014/023276, dated Jun. 30, 2014, 13 pages.

Invitation to Pay Additional Fees and Annex Partial International Search Report for PCT/US2015/015155, dated May 25, 2015, 8 Sheets.

Office Action issued on Apr. 21, 2014, for U.S. Appl. No. 13/933,743, (29 pages).

(56) References Cited

OTHER PUBLICATIONS

U.S. Appl. No. 14/133,979, filed Dec. 19, 2013, SanDisk Technologies Inc.
U.S. Appl. No. 14/225,116, filed Mar. 25, 2014, SanDisk Technologies Inc.
U.S. Appl. No. 14/225,176, filed Mar. 25, 2014, SanDisk Technologies Inc.
U.S. Appl. No. 14/264,262, filed Apr. 29, 2014, SanDisk Technologies Inc.
U.S. Appl. No. 14/264,407, filed Apr. 29, 2014, SanDisk Technologies Inc.
U.S. Appl. No. 14/317,274, filed Jun. 27, 2014, SanDisk Technologies Inc.
U.S. Appl. No. 14/517,134, filed Oct. 17, 2014, SanDisk Technologies Inc.
U.S. Appl. No. 14/611,785, filed Feb. 2, 2015, SanDisk Technologies Inc.
U.S. Appl. No. 14/748,808, filed Jun. 24, 2015, SanDisk Technologies Inc.
U.S. Appl. No. 14/834,830, filed Aug. 25, 2015, SanDisk Technologies Inc.
U.S. Appl. No. 62/154,916, filed Apr. 30, 2015, SanDisk Technologies Inc.
Invitation to Pay Additional Fees and Communication Relating to the Results of the Partial International Search from the International Searching Authority for International Application No. PCT/US2016/036724, dated Sep. 27, 2016, 9 pages.

\* cited by examiner

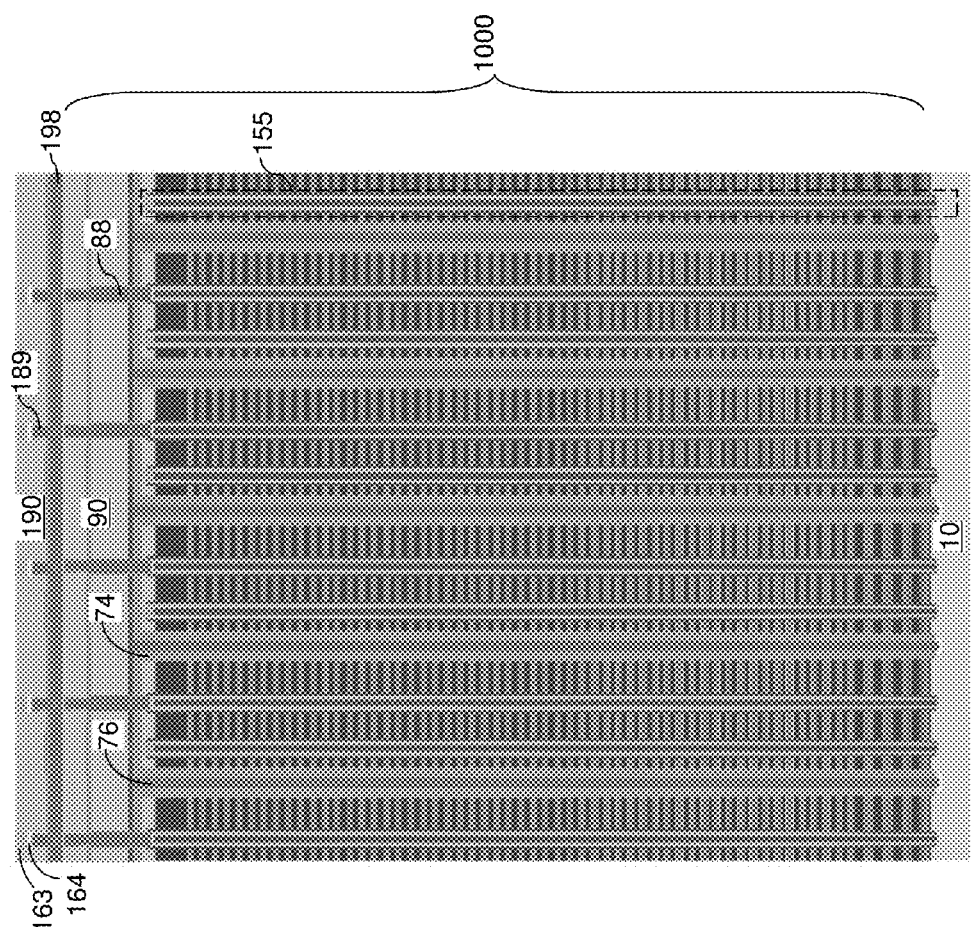

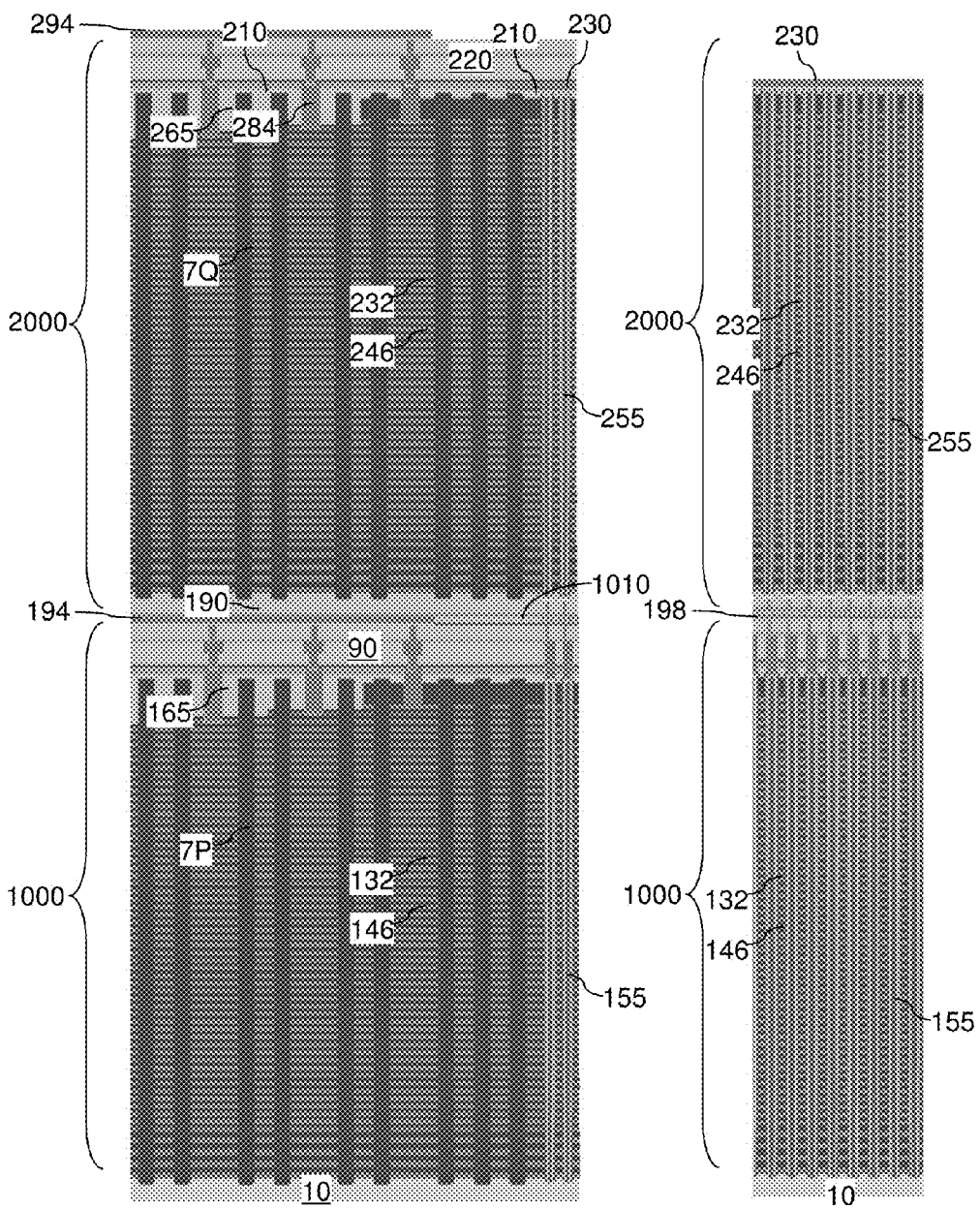

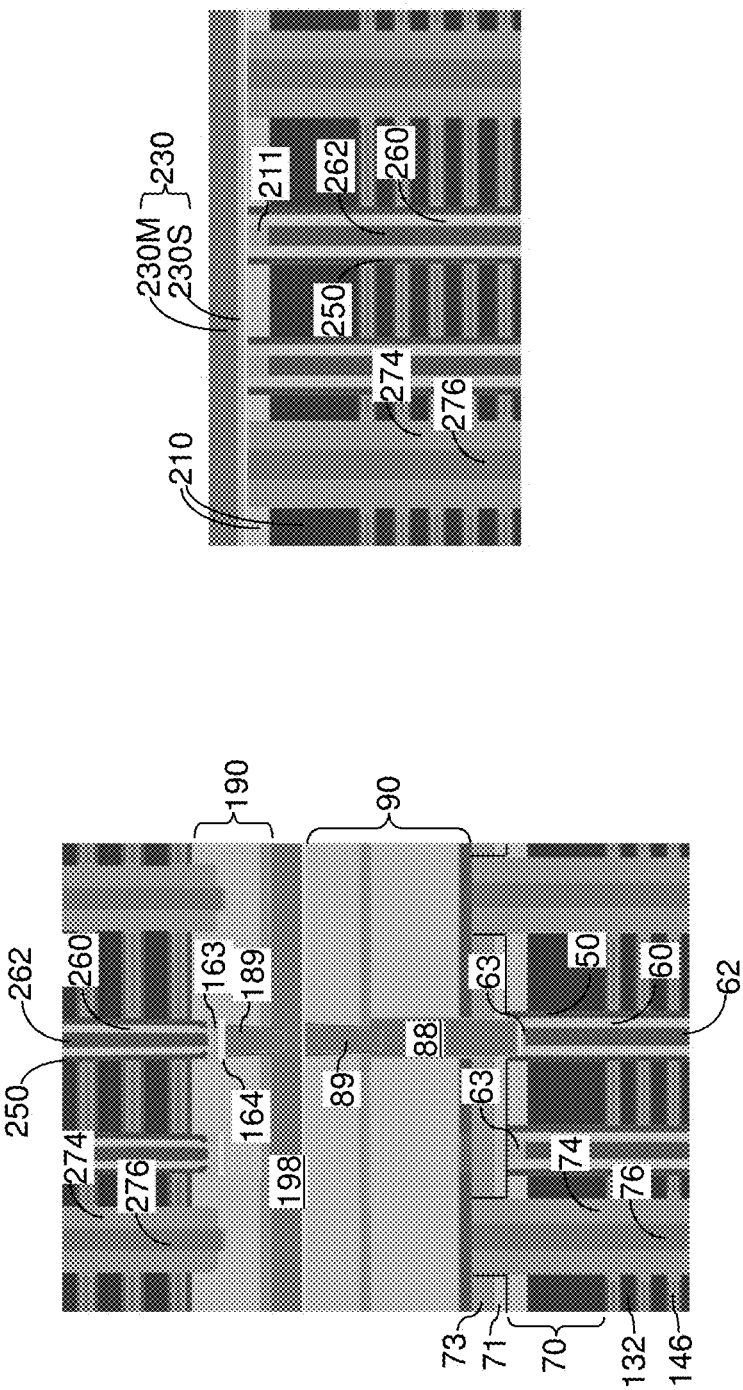

MULTI TIER THREE-DIMENSIONAL MEMORY DEVICES INCLUDING VERTICALLY SHARED BIT LINES

FIELD

The present disclosure relates generally to the field of semiconductor devices and specifically to three-dimensional semiconductor devices, such as vertical NAND strings, and methods of making thereof.

BACKGROUND

Three-dimensional vertical NAND strings having one bit per cell are disclosed in an article by T. Endoh, et. al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a multi-tier memory device is provided, which comprises: a first tier overlying a substrate and comprising a first alternating stack of first insulating layers and first electrically conductive layers, and first vertical transistors each including a first semiconductor channel and a first-tier top active region that contacts an upper end of the first semiconductor channel; bit lines overlying the first tier and electrically shorted to respective first-tier top active regions; and a second tier overlying the bit lines and comprising a second alternating stack of second insulating layers and second electrically conductive layers, and second vertical transistors each including a second semiconductor channel and a second-tier bottom active region that contacts a lower end of the second semiconductor channel. The bit lines are electrically shorted to respective second-tier bottom active regions.

According to another aspect of the present disclosure, a method of manufacturing a multi-tier memory device is provided. A first tier is formed over a substrate. The first tier comprises a first alternating stack of first insulating layers and first electrically conductive layers, and first vertical transistors each including a first semiconductor channel and a first-tier top active region that contacts an upper end of the first semiconductor channel. Bit lines are formed over the first tier. The bit lines are electrically shorted to respective first-tier top active regions. A second tier is formed over the bit lines. The second tier comprises a second alternating stack of second insulating layers and second electrically conductive layers, and second vertical transistors each including a second semiconductor channel and a second-tier bottom active region that contacts a lower end of the second semiconductor channel. The bit lines are electrically shorted to respective second-tier bottom active regions.

According to an aspect of the present disclosure, a multi-tier memory device is provided, which comprises a first tier overlying a substrate and comprising a first alternating stack of first insulating layers and first electrically conductive layers, first memory stack structures extending through the first alternating stack and each including a first semiconductor channel, and first-tier drain regions contacting an upper end of each first semiconductor channel; bit lines overlying the first tier and electrically shorted to respective first-tier drain regions; and a second tier overlying the bit lines and comprising a second alternating stack of second insulating layers and second electrically conductive layers, second memory stack structures extending through the second alternating stack and each including a second semiconductor channel, and second-tier drain regions contacting a lower end of each second semiconductor channel. The bit lines are electrically shorted to respective second-tier drain regions.

According to another aspect of the present disclosure, a method of manufacturing a multi-tier memory device is provided. A first tier is formed over a substrate. The first tier comprises a first alternating stack of first insulating layers and first electrically conductive layers, first memory stack structures extending through the first alternating stack and each including a first semiconductor channel, and first-tier drain regions contacting an upper end of each first semiconductor channel. Bit lines are formed over the first tier. The bit lines are electrically shorted to respective first-tier drain regions. A second tier is formed over the bit lines. The second tier comprises a second alternating stack of second insulating layers and second electrically conductive layers, second memory stack structures extending through the second alternating stack and each including a second semiconductor channel, and second-tier drain regions contacting a lower end of each second semiconductor channel. The bit lines are electrically shorted to respective second-tier drain regions.

BRIEF DESCRIPTION OF THE DRAWINGS

FIG. 6B is a vertical cross-sectional view of the exemplary structure of FIG. 6A along a second vertical plane.

FIG. 7A is a vertical cross-sectional view of the exemplary structure after formation of a second tier and source lines along the first vertical plane according to an embodiment of the present disclosure.

FIG. 7B is a vertical cross-sectional view of a device region of the exemplary structure of FIG. 7A along the first vertical plane.

FIG. 7D is a magnified view of the inset D in FIG. 7C.

FIG. 7E is a magnified view of the inset E in FIG. 7C.

DETAILED DESCRIPTION

Figure 1:
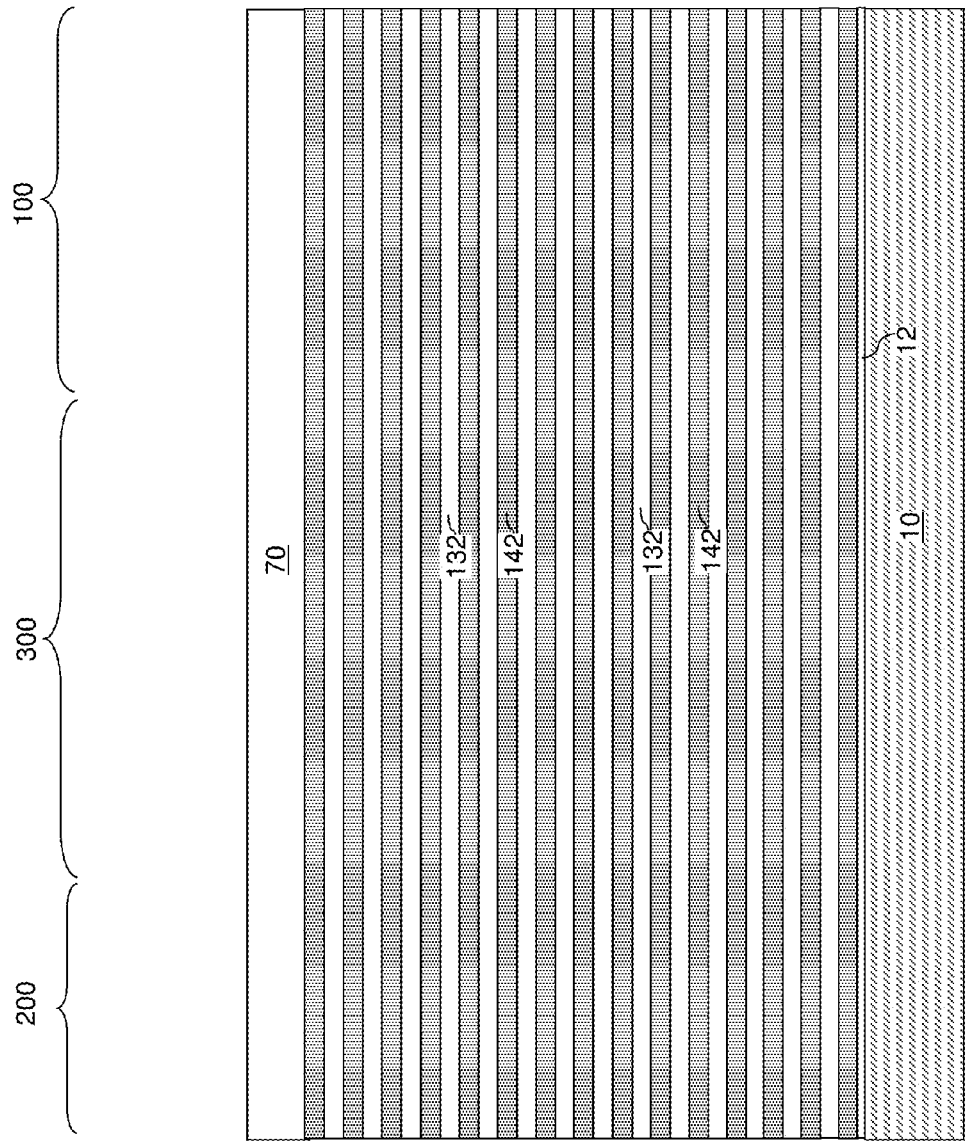
FIG. 1 is a vertical cross-sectional view of an exemplary structure after formation of a stack including an alternating plurality of first insulating layers and first spacer material layers according to an embodiment of the present disclosure.

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a substantially uniform thickness. A layer may extend over the entirety of an underlying or overlying structure, or may have an extent less than the extent of an underlying or overlying structure. Further, a layer may be a region of a homogeneous or inhomogeneous contiguous structure that has a thickness less than the thickness of the contiguous structure. For example, a layer may be located between any pair of horizontal planes between, or at, a top surface and a bottom surface of the contiguous structure. A layer may extend horizontally, vertically, and/or along a tapered surface. A substrate may be a layer, may include one or more layers therein, and/or may have one or more layer thereupon, thereabove, and/or therebelow.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate, such as a silicon wafer. The substrate can include a substrate semiconductor layer 10. The substrate semiconductor layer 10 is a semiconductor material layer, and can include at least one elemental semiconductor material (e.g., silicon), at least one III-V compound semiconductor material, at least one II-VI compound semiconductor material, at least one organic semiconductor material, or other semiconductor materials known in the art. The substrate semiconductor layer 10 may comprise an upper portion of a semiconductor substrate, a semiconductor layer located over the upper portion of the substrate or a doped semiconductor well located in the upper portion of a semiconductor substrate or in a semiconductor layer located over the upper portion of the substrate.

As used herein, a "semiconductor material" refers to a material having electrical conductivity in the range from $1.0 \times 10^{-6}$ S/cm to $1.0 \times 10^{5}$ S/cm, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulating material" or a "dielectric material" refers to a material having electrical conductivity less than $1.0 \times 10^{-6}$ S/cm. All measurements for electrical conductivities are made at the standard condition. The substrate semiconductor layer 10 can include at least one doped well (not expressly shown) having a substantially uniform dopant concentration therein.

The exemplary structure can have multiple regions for building different types of devices. Such areas can include, for example, a device region 100, a contact region 300, and a peripheral device region 200. In one embodiment, the substrate semiconductor layer 10 can include at least one a doped well in the device region 100. As used herein, a "doped well" refers to a portion of a semiconductor material having a doping of a same conductivity type (which can be p-type or n-type) and a substantially same level of dopant concentration throughout. The doped well can be the same as the substrate semiconductor layer 10 or can be a portion of the substrate semiconductor layer 10. The conductivity type of the doped well is herein referred to as a first conductivity type, which can be p-type or n-type. The dopant concentration level of the doped well is herein referred to as a first dopant concentration level. In one embodiment, the first dopant concentration level can be in a range from $1.0\times10^{15}/cm^3$ to $1.0\times10^{18}/cm^3$, although lesser and greater dopant concentration levels can also be employed. As used herein, a dopant concentration level refers to average dopant concentration for a given region.

Optionally, a gate dielectric layer 12 can be formed above the substrate semiconductor layer 10. The gate dielectric layer 12 can be employed as the gate dielectric for a first source select gate electrode. The gate dielectric layer 12 can include, for example, silicon oxide and/or a dielectric metal oxide (such as $HfO_2$, $ZrO_2$, $LaO_2$, etc.). The thickness of the gate dielectric layer 12 can be in a range from 3 nm to 30 nm, although lesser and greater thicknesses can also be employed.

A first alternating stack of first material layers (which can be first insulating layers 132) and second material layers (which are referred to first spacer material layers 142) is formed over the top surface of the substrate, which can be, for example, on the top surface of the gate dielectric layer 12. As used herein, a "material layer" refers to a layer including a material throughout the entirety thereof. As used herein, a "spacer material layer" refers to a material layer that is located between two other material layers, i.e., between an overlying material layer and an underlying material layer.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality. The first spacer material layers can be formed as electrically conductive layers, or can be replaced with electrically conductive layers in a subsequent processing step.

Each first material layer includes a first material, and each second material layer includes a second material that is different from the first material. In one embodiment, each first material layer can be a first insulating layer 132, and each second material layer can be a first sacrificial material layer 142. In this case, the stack can include an alternating plurality of first insulating layers 132 and first sacrificial material layers 142, and constitutes a prototype stack of alternating layers comprising first insulating layers 132 and first sacrificial material layers 142. As used herein, a "prototype" structure or an "in-process" structure refers to a transient structure that is subsequently modified in the shape or composition of at least one component therein.

The stack of the alternating plurality is herein referred to as an alternating stack (132, 142). In one embodiment, the alternating stack (132, 142) can include first insulating layers 132 composed of the first material, and first sacrificial material layers 142 composed of a second material different from that of first insulating layers 132. The first material of the first insulating layers 132 can be at least one insulating material. As such, each first insulating layer 132 can be an insulating material layer. Insulating materials that can be employed for the first insulating layers 132 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the first sacrificial material layers 142 can be first spacer material layers that comprise silicon nitride or a semiconductor material including at least one of silicon and germanium.

In one embodiment, the first insulating layers 132 can include silicon oxide, and first sacrificial material layers can include silicon nitride first sacrificial material layers. The first material of the first insulating layers 132 can be deposited, for example, by chemical vapor deposition (CVD). For example, if silicon oxide is employed for the first insulating layers 132, tetraethyl orthosilicate (TEOS) can be employed as the precursor material for the CVD process. The second material of the first sacrificial material layers 142 can be formed, for example, CVD or atomic layer deposition (ALD).

The first sacrificial material layers 142 can be suitably patterned so that conductive material portions to be subsequently formed by replacement of the first sacrificial material layers 142 can function as electrically conductive electrodes, such as the control gate electrodes of the monolithic three-dimensional NAND string memory devices to be subsequently formed. One or more of the top and bottom gate electrodes in the stack may function as the select gate electrodes. The first sacrificial material layers 142 may comprise a portion having a strip shape extending substantially parallel to the major (e.g., top) surface of substrate semiconductor layer 10.

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The number of repetitions of the pairs of a first insulating layer 132 and a first sacrificial material layer 142 (or gate electrodes 146 after replacement of layers 142) can be in a range from 2 to 1,024, and typically from 8 to 256, although a greater number of repetitions can also be employed. In one embodiment, each first sacrificial material layer 142 in the alternating stack (132, 142) can have a uniform thickness that is substantially invariant within each respective first sacrificial material layer 142.

Optionally, an insulating cap layer 70 can be formed over the alternating stack (132, 142). The insulating cap layer 70 includes a dielectric material that is different from the material of the first sacrificial material layers 142. In one embodiment, the insulating cap layer 70 can include a dielectric material that can be employed for the first insulating layers 132 as described above. The insulating cap layer 70 can have a greater thickness than each of the first insulating layers 132. The insulating cap layer 70 can be deposited, for example, by chemical vapor deposition. In one embodiment, the insulating cap layer 70 can be a silicon oxide layer.

Figure 2:
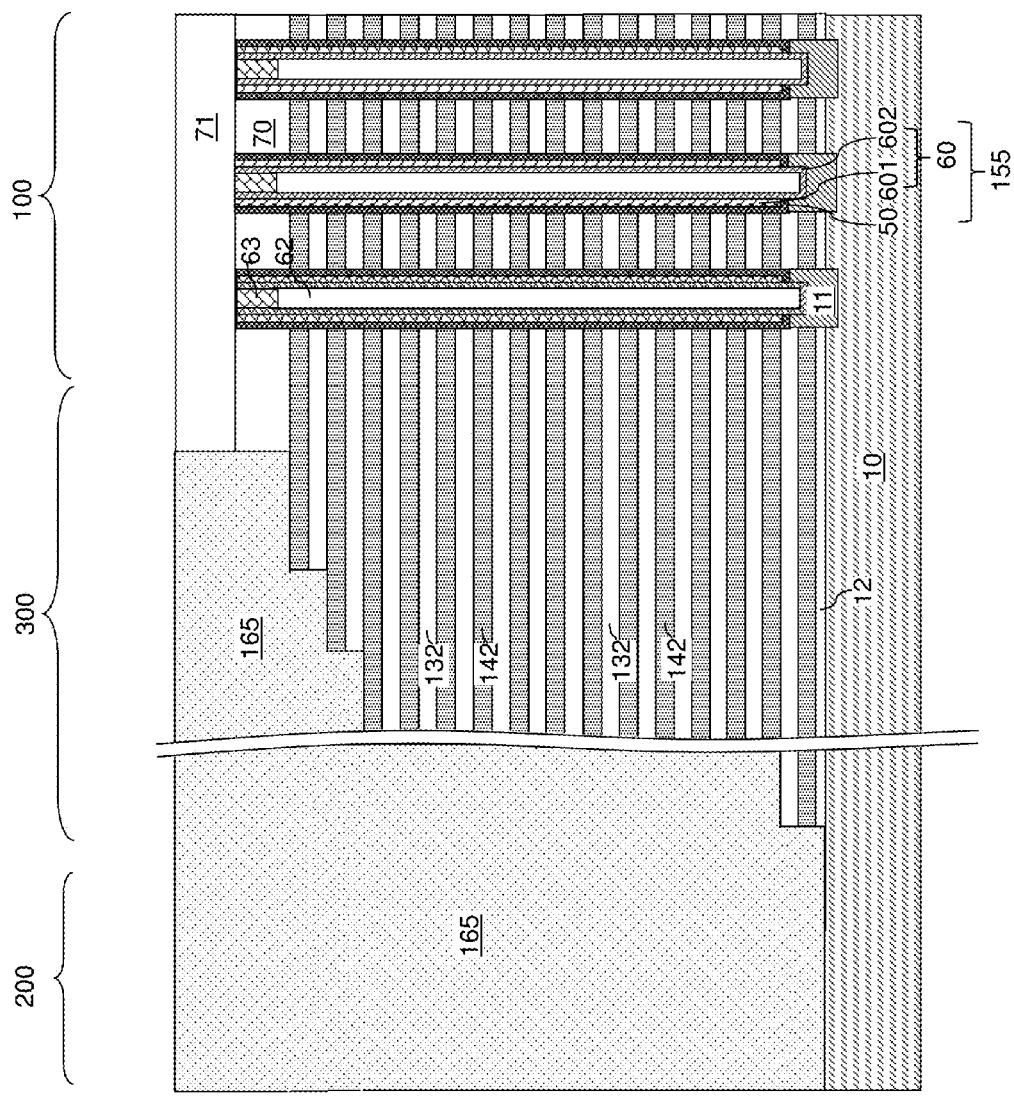
FIG. 2 is a vertical cross-sectional view of the exemplary structure after formation of first stepped surfaces and a first retro-stepped dielectric material portion according to an embodiment of the present disclosure.

Referring to FIG. 2, a lithographic material stack (not shown) including at least a photoresist layer can be formed over the insulating cap layer 70 and the alternating stack (132, 142), and can be lithographically patterned to form openings therein. The pattern in the lithographic material stack can be transferred through the insulating cap layer 70 and through entirety of the alternating stack (132, 142) by at least one anisotropic etch that employs the patterned lithographic material stack as an etch mask. Portions of the alternating stack (132, 142) underlying the openings in the patterned lithographic material stack are etched to form first memory openings. In other words, the transfer of the pattern in the patterned lithographic material stack through the alternating stack (132, 142) forms the first memory openings that extend through the alternating stack (132, 142). The chemistry of the anisotropic etch process employed to etch through the materials of the alternating stack (132, 142) can alternate to optimize etching of the first and second materials in the alternating stack (132, 142). The anisotropic etch can be, for example, a series of reactive ion etches. Optionally, the gate dielectric layer 12 may be used as an etch stop layer between the alternating stack (132, 142) and the substrate. The sidewalls of the first memory openings can be substantially vertical, or can be tapered. The patterned lithographic material stack can be subsequently removed, for example, by ashing.

Epitaxial channel portions 11 can be optionally formed at the bottom of each first memory opening, for example, by selective epitaxy of a semiconductor material. First memory stack structures 155 can be formed in the first memory openings and on top of the epitaxial channel portions 11 (if present). Each first memory stack structure 155 can include a memory film 50 and a first semiconductor channel 60. Each memory film can include from outside to inside at least one blocking dielectric, a memory material layer, and a tunneling dielectric. The memory material layer 50 may comprise a plurality of charge storage elements, such as portions of a charge trapping dielectric layer (e.g., silicon nitride layer) or a plurality of floating gates. Each first semiconductor channel 60 includes at least one semiconductor material layer that is employed as a vertical portion of a semiconductor channel, and can include an outer semiconductor material layer 601 and an inner semiconductor material layer 602. A dielectric core 62 can be formed within a cavity in each first semiconductor channel 60, for example, by deposition and recessing of a dielectric material. A drain region 63 can be formed in an upper portion of each first memory opening such that the drain regions 63 contact upper portions of the first semiconductor channels 60. Each drain region 63 is a top active region, and is herein referred to as a first-tier top active region, i.e., a top active region located within a first tier.

An optional first contact level dielectric layer 71 can be formed over the substrate semiconductor layer 10. As an optional structure, the first contact level dielectric layer 71 may, or may not, be formed. In case the first contact level dielectric layer 71 is formed, the first contact level dielectric layer 71 includes a dielectric material such as silicon oxide, silicon nitride, silicon oxynitride, porous or non-porous organosilicate glass (OSG), or a combination thereof. If an organosilicate glass is employed, the organosilicate glass may, or may not, be doped with nitrogen. The first contact level dielectric layer 71 can be formed over a horizontal plane including the top surface of the insulating cap layer 70 and the top surfaces of the drain regions 63. The first contact level dielectric layer 71 can be deposited by chemical vapor deposition, atomic layer deposition (ALD), spin-coating, or a combination thereof. The thickness of the first contact level dielectric layer 71 can be in a range from 10 nm to 300 nm, although lesser and greater thicknesses can also be employed.

In one embodiment, the first contact level dielectric layer 71 can be formed as a dielectric material layer having a uniform thickness throughout. The first contact level dielectric layer 71 may be formed as a single dielectric material layer, or can be formed as a stack of a plurality of dielectric material layers. Alternatively, formation of the first contact level dielectric layer 71 may be merged with formation of at least one line level dielectric layer (not shown). While the present disclosure is described employing an embodiment in which the first contact level dielectric layer 71 is a structure separate from an optional second contact level dielectric layer or at least one line level dielectric layer to be subsequently deposited, embodiments in which the first contact level dielectric layer 71 and at least one line level dielectric layer are formed at a same processing step, and/or as a same material layer, are expressly contemplated herein.

Optionally, a portion (not shown) of the first alternating stack (132, 142) can be removed, for example, by applying and patterning a photoresist layer with an opening and by transferring the pattern of the opening through the first alternating stack (132, 142) employing an etch such as an anisotropic etch. An optional trench extending through the entire thickness of the first alternating stack (132, 142) can be formed within an area that includes a peripheral device region (not shown). Subsequently, the trench can be filled with an optional dielectric material such as silicon oxide. Excess portions of the dielectric material can be removed from above the top surface of the first contact level dielectric layer 71 by a planarization process such as chemical mechanical planarization and/or a recess etch. The top surfaces of the first contact level dielectric layer 71 can be employed as a stopping surface during the planarization. The remaining dielectric material in the trench constitutes a dielectric material portion (not shown).

In one embodiment, the first contact level dielectric layer 71, the insulating cap layer 70, and the first alternating stack (132, 142) can be removed from the peripheral device region 200, for example, by a masked etch process. In addition, a stepped cavity can be formed within the contact region 300 by patterning a portion of the first alternating stack (132, 142). As used herein, a "stepped cavity" refers to a cavity having stepped surfaces. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "step" refers to a vertical shift in the height of a set of adjoined surfaces.

The stepped cavity can have various stepped surfaces such that the horizontal cross-sectional shape of the stepped cavity changes in steps as a function of the vertical distance from the top surface of the substrate semiconductor layer 10. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating stack is defined as the relative position of a pair of a first material layer and a second material layer within the structure. After formation of all stepped surfaces, mask material layers employed to form the stepped surfaces can be removed, for example, by ashing. Multiple photoresist layers and/or multiple etch processes can be employed to form the stepped surfaces.

A dielectric material such as silicon oxide is deposited in the stepped cavity and over the peripheral devices in the peripheral device region 200. Excess portions of the deposited dielectric material can be removed from above the top surface of the first contact level dielectric layer 71, for example, by chemical mechanical planarization (CMP). The remaining portion of the deposited dielectric material filling the stepped cavity in the contact region 300 and overlying the substrate semiconductor layer 10 in the peripheral device region 200 constitutes a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. If silicon oxide is employed as the dielectric material, the silicon oxide of the first retro-stepped dielectric material portion 165 may, or may not, be doped with dopants such as B, P, and/or F. The top surface of the first retro-stepped dielectric material portion 165 can be coplanar with the top surface of the first contact level dielectric layer 71.

Figure 3A:
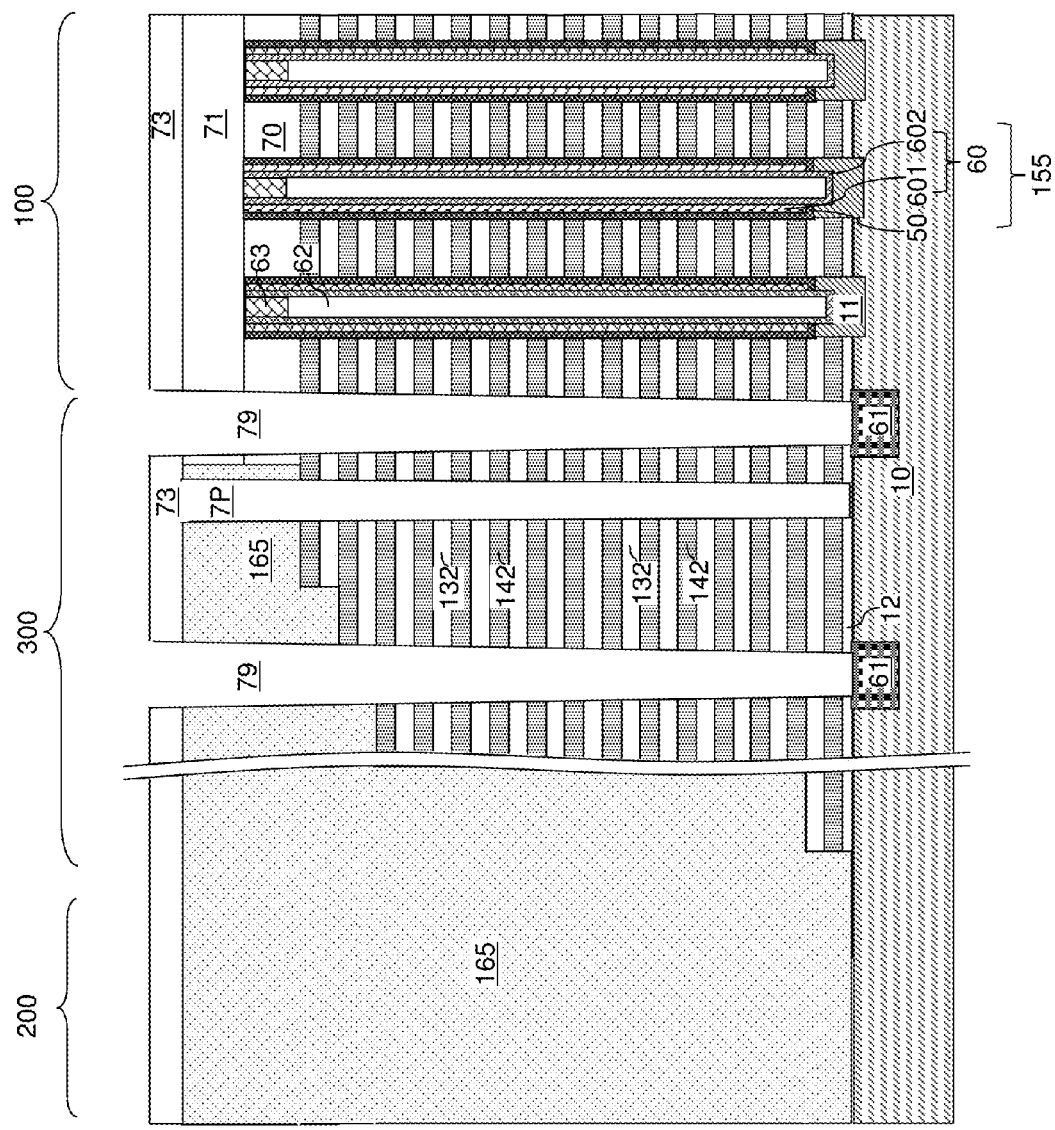
FIG. 3A is a vertical cross-sectional view of the exemplary structure after formation of first source contact trenches and first-tier source regions according to an embodiment of the present disclosure.
Figure 3B:
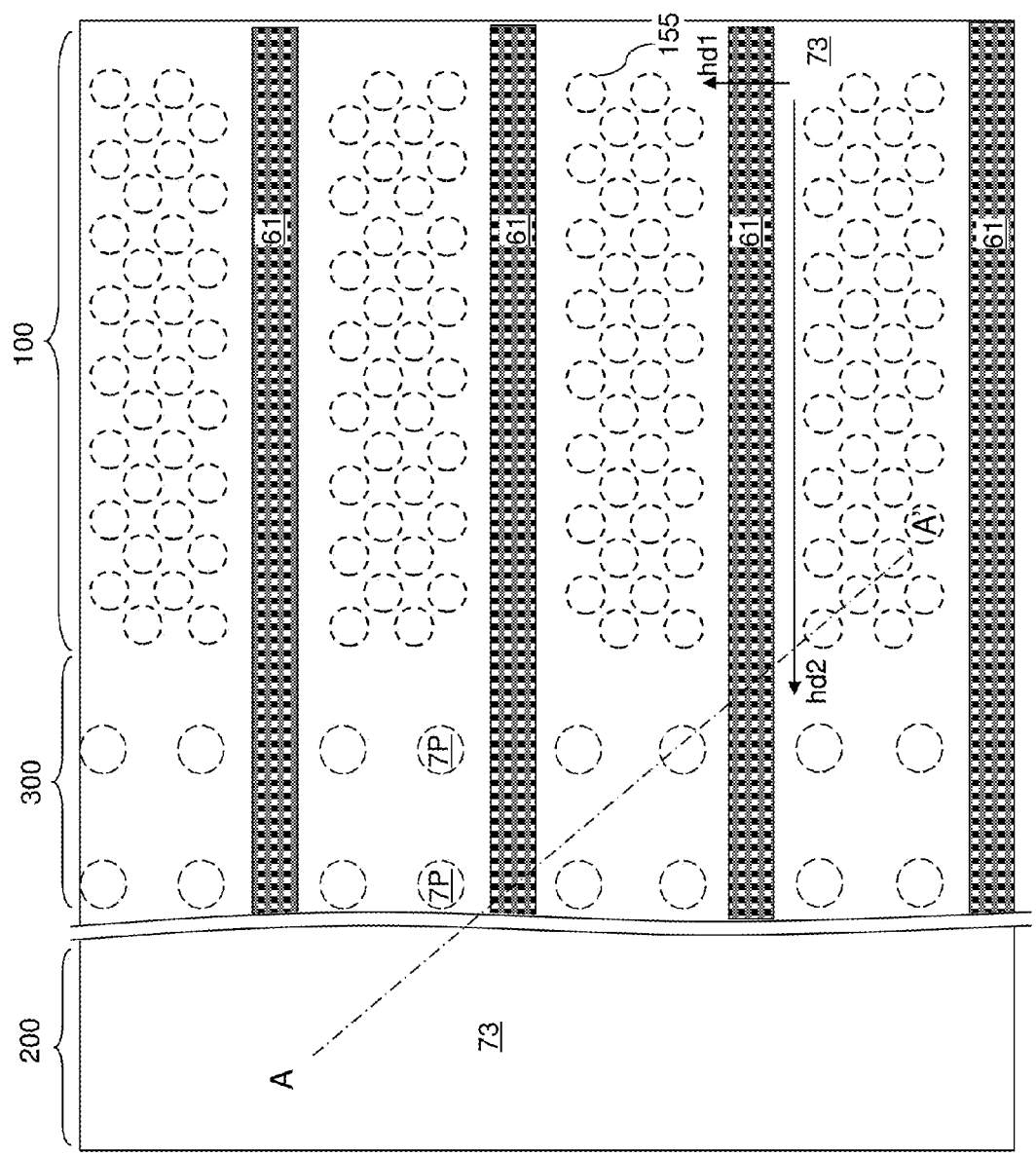
FIG. 3B is a top-down view of the exemplary structure of FIG. 3A.

Referring to FIGS. 3A and 3B, first dielectric support pillars 7P may be optionally formed through the first retro-stepped dielectric material portion 165 and/or through the first contact level dielectric layer 71 and/or through the first alternating stack (132, 142). The plane A-A' in FIG. 3B corresponds to the plane of the vertical cross-sectional view of FIG. 3A. In one embodiment, the first dielectric support pillars 7P can be formed in the contact region 300, which is located adjacent to the device region 100. The first dielectric support pillars 7P can be formed, for example, by forming an opening extending through the first retro-stepped dielectric material portion 165 and/or through the first alternating stack (132, 142) and at least to the top surface of the substrate semiconductor layer 10, and by filling the opening with a dielectric material that is resistant to the etch chemistry to be employed to remove the first sacrificial material layers 142.

In one embodiment, the first dielectric support pillars 7P can include silicon oxide and/or a dielectric metal oxide such as aluminum oxide. In one embodiment, the portion of the dielectric material that is deposited over the first contact level dielectric layer 71 concurrently with deposition of the first dielectric support pillars 7P can be present over the first contact level dielectric layer 71 as a second contact level dielectric layer 73. Each of the first dielectric support pillars 7P and the second contact level dielectric layer 73 is an optional structure. As such, the second contact level dielectric layer 73 may, or may not, be present over the insulating cap layer 70 and the first retro-stepped dielectric material portion 165. The first contact level dielectric layer 71 and the second contact level dielectric layer 73 are herein collectively referred to as at least one contact level dielectric layer (71, 73). In one embodiment, the at least one contact level dielectric layer (71, 73) can include both the first and second contact level dielectric layers (71, 73), and optionally include any additional via level dielectric layer that can be subsequently formed. In another embodiment, the at least one contact level dielectric layer (71, 73) can include only the first contact level dielectric layer 71 or the second contact level dielectric layer 73, and optionally include any additional via level dielectric layer that can be subsequently formed. Alternatively, formation of the first and second contact level dielectric layers (71, 73) may be omitted, and at least one via level dielectric layer may be subsequently formed, i.e., after formation of a first source contact via structure.

The second contact level dielectric layer 73 and the first dielectric support pillars 7P can be formed as a single contiguous structure of integral construction, i.e., without any material interface therebetween. In another embodiment, the portion of the dielectric material that is deposited over the first contact level dielectric layer 71 concurrently with deposition of the first dielectric support pillars 7P can be removed, for example, by chemical mechanical planarization or a recess etch. In this case, the second contact level dielectric layer 73 is not present, and the top surface of the first contact level dielectric layer 71 can be physically exposed.

A photoresist layer (not shown) can be applied over the at least one contact level dielectric layer (71, 73), and can be lithographically patterned to form openings within areas between the memory blocks. In one embodiment, the memory blocks can be laterally spaced from one another along a first horizontal direction hd1, and the dimension of each opening in the photoresist layer along the first horizontal direction hd1 can be less than the spacing between neighboring clusters (i.e., sets) of the first memory stack structures 155 along the first horizontal direction hd1. Further, the dimension of each opening in the photoresist layer along a second horizontal direction hd2 (which is parallel to the lengthwise direction of each cluster of first memory stack structures 155) can be greater than the extent of each cluster of the first memory stack structures 155 along the second horizontal direction hd2.

First backside contact trenches 79 can be formed between each neighboring pair of clusters of the first memory stack structures 155 by transferring the pattern of the openings in the photoresist layer through the at least one contact level dielectric layer (71, 73), the first retro-stepped dielectric material portion 165, and the first alternating stack (132, 142). A top surface of the substrate semiconductor layer 10 can be physically exposed at the bottom of each first backside contact trench 79. In one embodiment, each first backside contact trench 79 can extend along the second horizontal direction hd2 so that clusters of the first memory stack structures 155 are laterally spaced along the first horizontal direction hd1. Each cluster of first memory stack structures 155 in conjunction with the portions of the first alternating stack (132, 142) that surround the cluster constitutes a memory block. Each memory block is laterally spaced from one another by the first backside contact trenches 79.

In one embodiment, first-tier source regions 61 can be formed in, or on, portions of the substrate semiconductor layer 10 underlying the first backside contact trenches 79 by implantation of dopants of a second conductivity type (which is the opposite of the first conductivity type) after formation of the first backside contact trenches 79. For example, if the first conductivity type is p-type, the second conductivity type is n-type, and vice versa. Each first-tier source region 61 is a first-tier bottom active region, i.e., a bottom active region located within a first tier.

Figure 4:
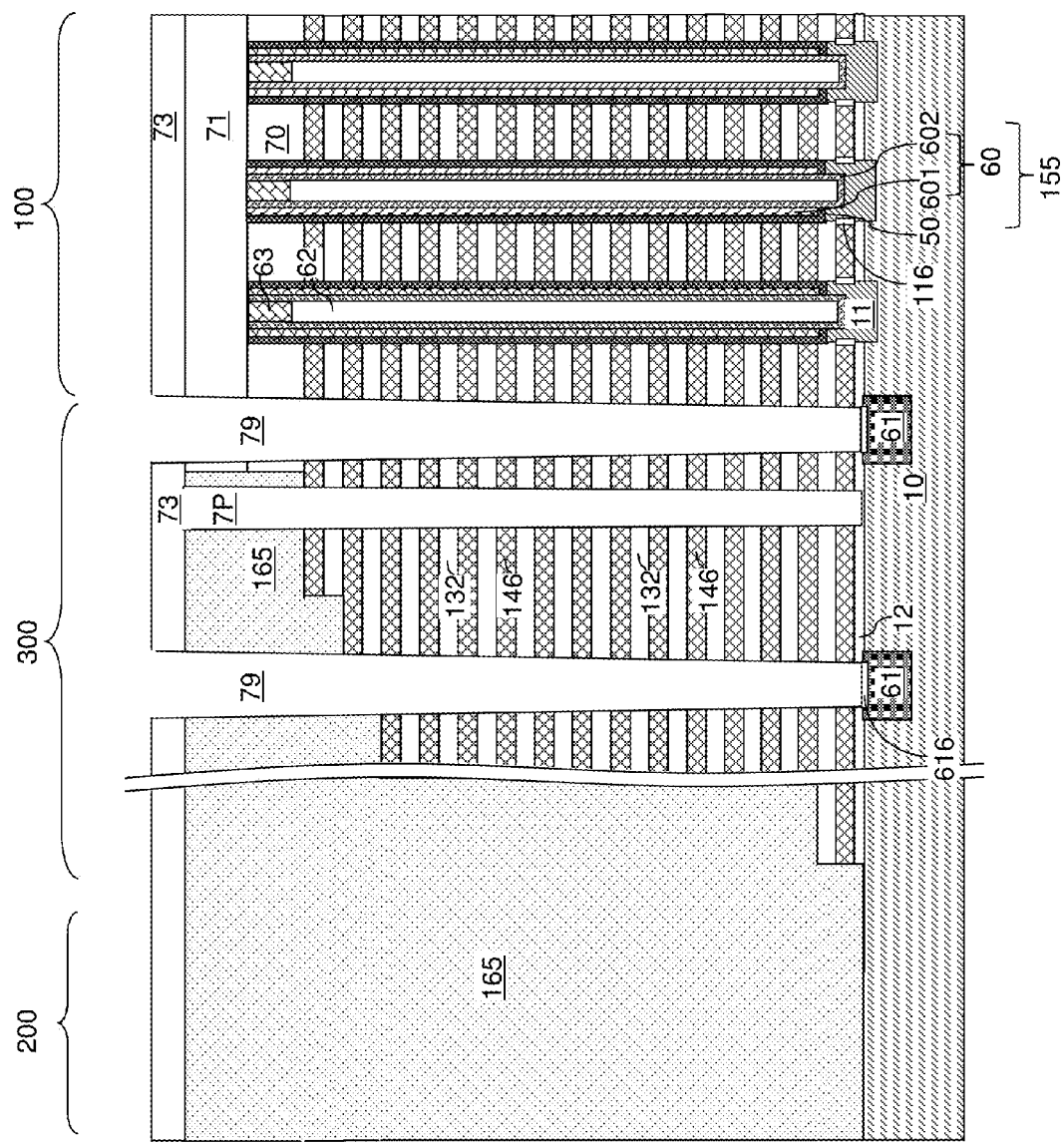
FIG. 4 is a vertical cross-sectional view of the exemplary structure after replacement of the first spacer material layers with first electrically conductive layers according to an embodiment of the present disclosure.

Referring to FIG. 4, an etchant that selectively etches the second material of the first sacrificial material layers 142 with respect to the first material of the first insulating layers 132 can be introduced into the first backside contact trenches 79, for example, employing an etch process. First backside recesses are formed in volumes from which the first sacrificial material layers 142 are removed. The removal of the second material of the first sacrificial material layers 142 can be selective to the first material of the first insulating layers 132, the material of the first dielectric support pillars 7P, the material of the first retro-stepped dielectric material portion 165, the semiconductor material of the substrate semiconductor layer 10, and the material of the outermost layer of the first memory films 50. In one embodiment, the first sacrificial material layers 142 can include silicon nitride, and the materials of the first insulating layers 132, the first dielectric support pillars 7P, and the first retro-stepped dielectric material portion 165 can be selected from silicon oxide and dielectric metal oxides. In another embodiment, the first sacrificial material layers 142 can include a semiconductor material such as polysilicon, and the materials of the first insulating layers 132, the first dielectric support pillars 7P, and the first retro-stepped dielectric material portion 165 can be selected from silicon oxide, silicon nitride, and dielectric metal oxides. In this case, the depth of the first backside contact trenches 79 can be modified so that the bottommost surface of the first backside contact trenches 79 is located within the gate dielectric layer 12, i.e., to avoid physical exposure of the top surface of the substrate semiconductor layer 10.

The etch process that removes the second material selective to the first material and the outermost layer of the first memory films 50 can be a wet etch process employing a wet etch solution, or can be a gas phase (dry) etch process in which the etchant is introduced in a vapor phase into the first backside contact trenches 79. For example, if the first sacrificial material layers 142 include silicon nitride, the etch process can be a wet etch process in which the exemplary structure is immersed within a wet etch tank including phosphoric acid, which etches silicon nitride selective to silicon oxide, silicon, and various other materials employed in the art. The first dielectric support pillars 7P, the first retro-stepped dielectric material portion 165, and the first memory stack structures 155 provide structural support while the first backside recesses are present within volumes previously occupied by the first sacrificial material layers 142.

Each first backside recess can be a laterally extending cavity having a lateral dimension that is greater than the vertical extent of the cavity. In other words, the lateral dimension of each first backside recess can be greater than the height of the first backside recess 143. A plurality of first backside recesses can be formed in the volumes from which the second material of the first sacrificial material layers 142 is removed. The first memory openings in which the first memory stack structures 155 are formed are herein referred to as front side recesses or front side cavities in contrast with the first backside recesses 143. In one embodiment, the device region 100 comprises an array of monolithic three-dimensional NAND strings having a plurality of device levels disposed above the substrate semiconductor layer 10. In this case, each first backside recess can define a space for receiving a respective word line of the array of monolithic three-dimensional NAND strings.

Each of the plurality of first backside recesses can extend substantially parallel to the top surface of the substrate semiconductor layer 10. A first backside recess can be vertically bounded by a top surface of an underlying first insulating layer 132 and a bottom surface of an overlying first insulating layer 132. In one embodiment, each first backside recess can have a uniform height throughout. Optionally, a backside blocking dielectric layer can be formed in the first backside recesses.

Subsequently, physically exposed surface portions of epitaxial channel portions 11 and the first-tier source regions 61 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a dielectric spacer 116, and to convert a surface portion of each first-tier source region 61 into a sacrificial dielectric portion 616. In one embodiment, each dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The dielectric spacers 116 include a dielectric material that includes the same semiconductor element as the epitaxial channel portions 11 and additionally includes at least one non-metallic element such as oxygen and/or nitrogen such that the material of the dielectric spacers 116 is a dielectric material. In one embodiment, the dielectric spacers 116 can include a dielectric oxide, a dielectric nitride, or a dielectric oxynitride of the semiconductor material of the epitaxial channel portions 11. Likewise, each sacrificial dielectric portion 616 includes a dielectric material that includes the same semiconductor element as the first-tier source regions 61 and additionally includes at least one non-metallic element such as oxygen and/or nitrogen such that the material of the sacrificial dielectric portions 616 is a dielectric material. In one embodiment, the sacrificial dielectric portions 616 can include a dielectric oxide, a dielectric nitride, or a dielectric oxynitride of the semiconductor material of the first-tier source region 61.

A backside blocking dielectric layer (not shown) can be optionally formed. The backside blocking dielectric layer, if present, comprises a dielectric material that functions as a control gate dielectric for the control gates to be subsequently formed in the first backside recesses 143. In case at least one blocking dielectric is present within each first memory stack structure 155, the backside blocking dielectric layer is optional. In case a blocking dielectric is not present in the first memory stack structures 155, the backside blocking dielectric layer is present.

At least one metallic material can be deposited in the plurality of first backside recesses 143, on the sidewalls of the first backside contact trenches 79, and over the top surface of the second contact level dielectric layer 73. As used herein, a metallic material refers to an electrically conductive material that includes at least one metallic element.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the plurality of first backside recesses include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the plurality of first backside recesses can be a combination of titanium nitride layer and a tungsten fill material.

In one embodiment, the metallic material can be deposited by chemical vapor deposition or atomic layer deposition. In one embodiment, the metallic material can be employing at least one fluorine-containing precursor gas as a precursor gas during the deposition process. In one embodiment, the molecule of the at least one fluorine-containing precursor gas cam comprise a compound of at least one tungsten atom and at least one fluorine atom. For example, if the metallic material includes tungsten, $WF_6$ and $H_2$ can be employed during the deposition process.

A plurality of first electrically conductive layers 146 can be formed in the plurality of first backside recesses 143, and a contiguous metallic material layer (not shown) can be formed on the sidewalls of each first backside contact trench 79 and over the at least one contact level dielectric layer (71, 73). Thus, each first sacrificial material layer 142 can be replaced with a first electrically conductive layer 146. A backside cavity is present in the portion of each first backside contact trench 79 that is not filled with the backside blocking dielectric layer and the contiguous metallic material layer.

The deposited metallic material of the contiguous metallic material layer is subsequently etched back from the sidewalls of each first backside contact trench 79 and from above the second contact level dielectric layer 73, for example, by an isotropic etch. Each remaining portion of the deposited metallic material in the first backside recesses constitutes a first electrically conductive layer 146. Each first electrically conductive layer 146 can be a conductive line structure.

A subset of the first electrically conductive layers 146 can function as a combination of a plurality of control gate electrodes located at a same level and a word line electrically interconnecting, i.e., electrically shorting, the plurality of control gate electrodes located at the same level. The plurality of control gate electrodes within the first electrically conductive layers 146 are the control gate electrodes for the vertical memory devices including the first memory stack structures 155. In other words, a subset of the first electrically conductive layers 146 can be a word line that functions as a common control gate electrode for the plurality of vertical memory devices. Optionally, the sacrificial dielectric portions 616 can be removed from above the first-tier source regions 61 during the last processing step of the anisotropic etch.

Figure 5A:
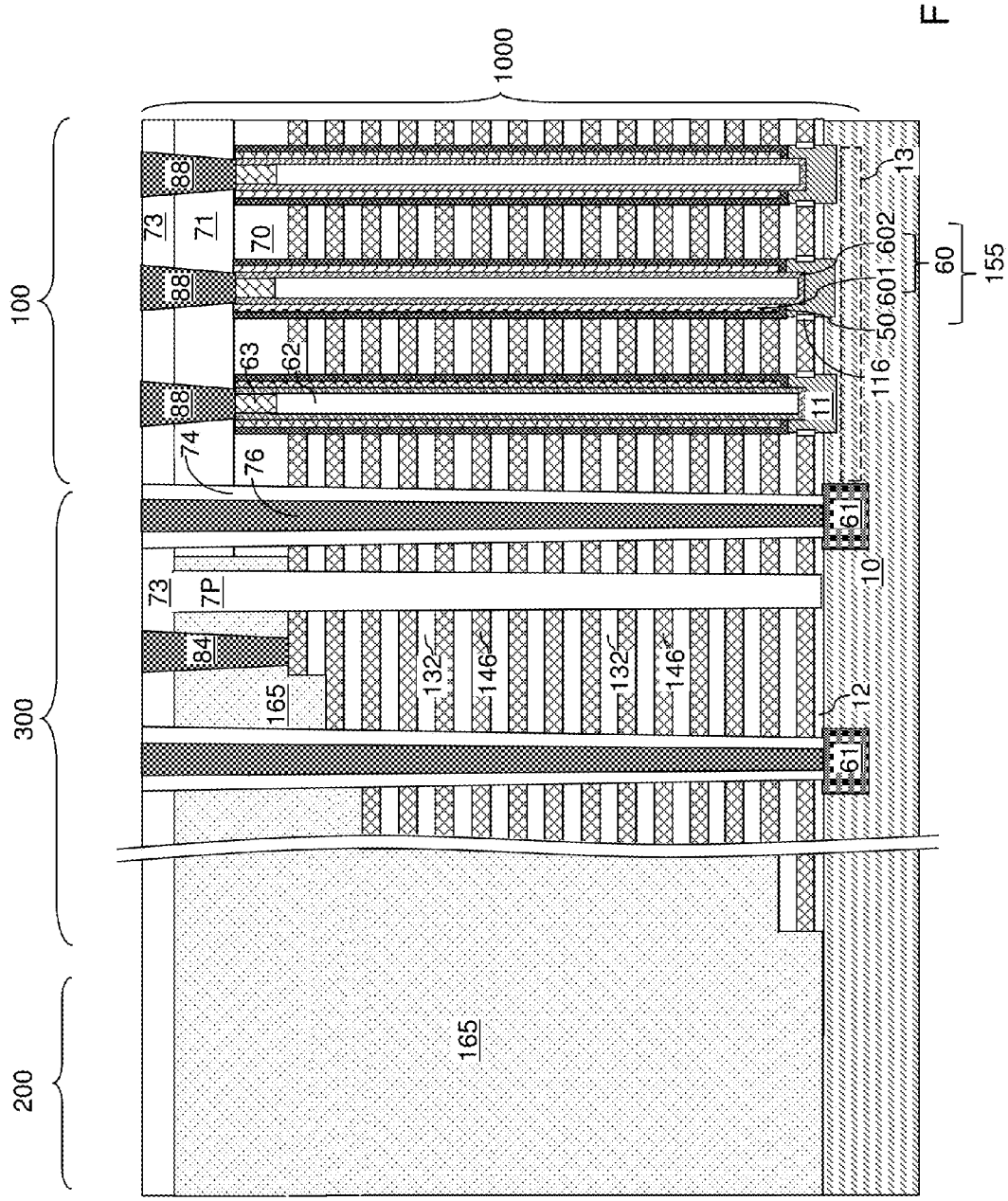
FIG. 5A is a vertical cross-sectional structure of the exemplary structure after formation of various contact via structures according to an embodiment of the present disclosure.
Figure 5B:
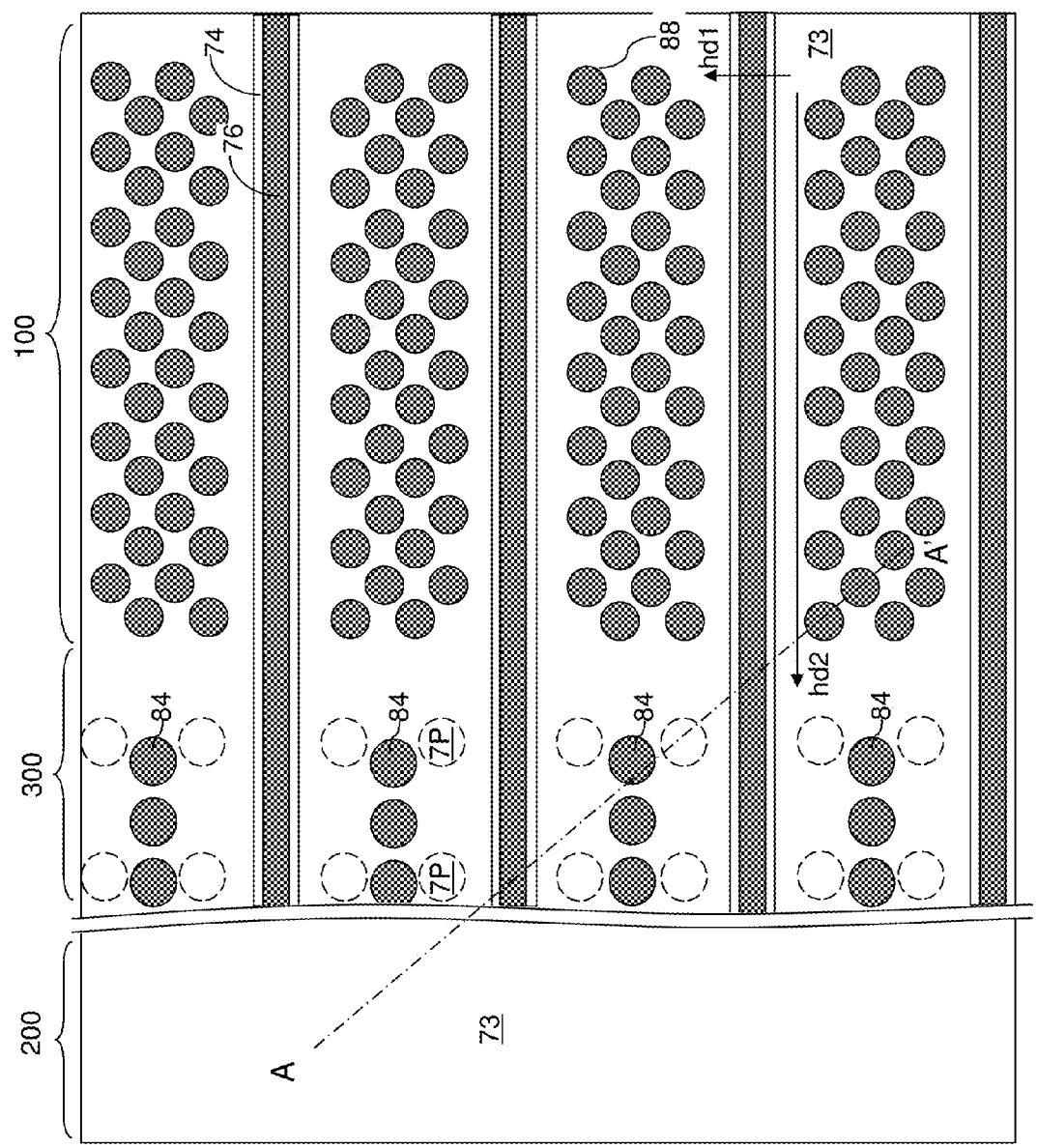
FIG. 5B is a top-down view of the exemplary structure of FIG. 5A.

Referring to FIGS. 5A and 5B, an insulating material layer can be formed in the first backside contact trenches 79 and over the at least one contact level dielectric layer (71, 73) by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. The thickness of the insulating material layer can be in a range from 1.5 nm to 60 nm, although lesser and greater thicknesses can also be employed.

Subsequently, an anisotropic etch is performed to remove horizontal portions of the insulating material layer and to optionally remove the horizontal portion of the backside blocking dielectric layer from above the at least one contact level dielectric layer (71, 73). Each remaining portion of the insulating material layer inside a first backside contact trench 79 constitutes a vertically elongated annular structure with a vertical cavity therethrough, which is herein referred to as a first insulating spacer 74. In one embodiment, an annular bottom surface of the first insulating spacer 74 contacts a top surface of the first-tier source region 61.

Each first insulating spacer 74 can be formed over the sidewalls of a first backside contact trench 79, and can be formed directly on substantially vertical sidewalls of the first electrically conductive layers 146. The thickness of each first insulating spacer 74, as measured at a bottom portion thereof, can be in a range from 1.5 nm to 60 nm, although lesser and greater thicknesses can also be employed.

Photolithographic processes and anisotropic etch processes can be repeatedly employed to form various via cavities that extend from the top surface of the at least one contact level dielectric layer (71, 73) to various conductive elements within the exemplary structure. For example, drain contact via cavities can be formed over each first memory stack structure 155 in the device region 100. Control gate via cavities can be formed over the stepped surfaces of the contact region 300.

At least one conductive material, which can include a metallic liner (such as TiN, TaN, or WN) and a conductive fill material (such as W, Cu, Al, Co, Ru, or a combination thereof), can be deposited in the various via cavities, and can be subsequently planarized, for example, by chemical mechanical planarization (CMP). Remaining portions of the at least one conductive material filling the various via cavities constitute various contact via structures. The various contact via structures can include, for example, first source contact via structures 76 filling the first backside contact trenches, drain contact via structures 88 filling the drain contact via cavities and contacting the drains 63 over the first memory stack structures 155, and first control gate contact via structures 84 that contact the first electrically conductive layers 146 (which function as control gate electrodes, first source select gate electrodes, or first drain select gate electrodes).

Horizontal channels 13, which are horizontal portions of the substrate semiconductor layer 10, extend between a respective first-tier source region 61 and a respective subset of first semiconductor channels 60. The exemplary structure of FIGS. 5A and 5B include a first tier 1000, which includes all structures above the substrate semiconductor layer 10, the first-tier source regions 61, and the horizontal channels 13.

Figure 6A:
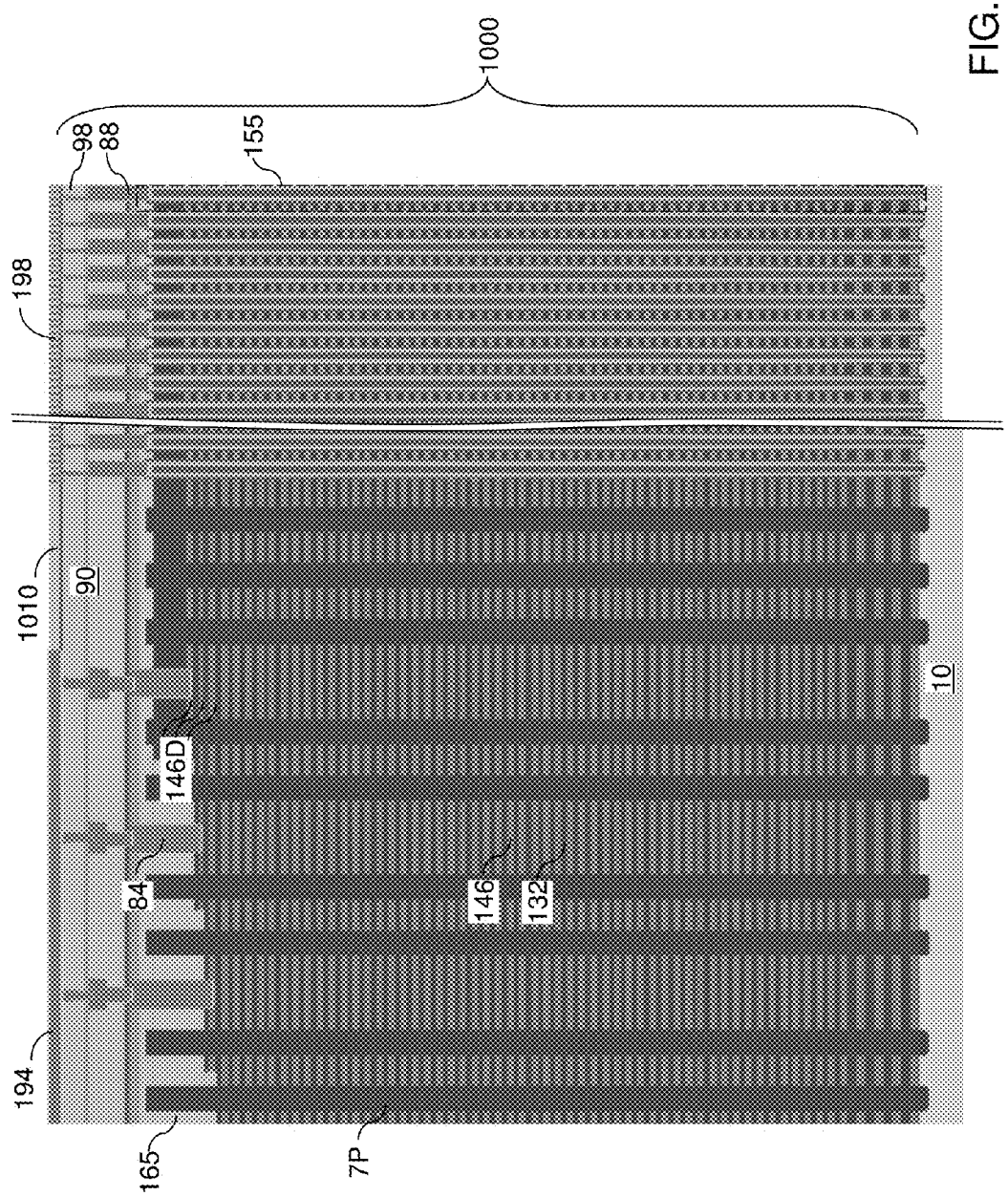
FIG. 6A is a vertical cross-sectional view of the exemplary structure after formation of a first tier, bit lines, and additional inter-tier interconnect structures along a first vertical plane according to an embodiment of the present disclosure.

Referring to FIGS. 6A and 6B, at least one additional contact level dielectric layer and additional interconnect structures can be formed over the at least one contact level dielectric layer (71, 73). FIG. 6A is a vertical cross section along the word line direction hd2 and FIG. 6B is a vertical cross section along the bit line direction hd1 shown in FIG. 5B. As used herein, interconnect structures collectively refer to lateral interconnect structures (i.e., structures that provide lateral electrically conductive paths) such as conductive lines and vertical interconnect structures (i.e., structures that provide vertical electrically conductive paths) such as via structures. The interconnect structures can be metal structures.

The at least one contact level dielectric layer (71, 73) and the at least one additional contact level dielectric layer are herein collectively referred to as first tier cap dielectric layer 90, or a first dielectric material layer. The first tier cap dielectric layer 90 can include a stack of multiple dielectric material layers or a single dielectric material layer depending on the integration scheme employed to form the exemplary structure. The drain contact via structures 88 and any overlying interconnect structures 98 that are electrically shorted to the drain contact via structures and embedded within any portion of the first tier cap dielectric layer 90 are herein referred to as first drain-side interconnect structures. The first tier cap dielectric layer 90 and the first drain-side interconnect structures (88, 98) are incorporated into the first tier 1000.

Thus, the first tier 1000 is formed over a substrate, which includes a lower portion of the substrate semiconductor layer 10. The first tier 1000 comprises a first alternating stack (132, 146) of first insulating layers 132 and first electrically conductive layers 146, first memory stack structures 155 extending through the first alternating stack (132, 146) and each including a first semiconductor channel 60, and first-tier drain regions 63 contacting an upper end of each first semiconductor channel 60. First drain-side interconnect structures (88, 98) are formed on the first-tier drain regions 63.

An inter-tier dielectric material layer 1010 can be formed over the first tier 1000. The inter-tier dielectric material layer 1010 includes a dielectric material such as silicon oxide, organosilicate glass, and/or silicon nitride. The inter-tier dielectric material layer 1010 can be formed, for example, by chemical vapor deposition. The thickness of the inter-tier dielectric material layer 1010 can be in a range from 100 nm to 1,000 nm, although lesser and greater thicknesses can also be employed.

Inter-tier interconnect structures can be formed in the inter-tier dielectric material layer 1010. The inter-tier interconnect structures can include bit lines 198 that contact topmost surfaces of the first drain-side interconnect structures (88, 98) embedded in the first tier cap dielectric layer 90. Each bit line 198 can be electrically shorted to respective first-tier drain regions 63. In one embodiment, the bit lines 198 can extend parallel to the first horizontal direction hd1 (i.e., bit line direction), and perpendicular to the second horizontal direction hd2 (i.e., word line direction), where the first and second horizontal directions (hd1, hd2) are shown in FIG. 3B. The inter-tier interconnect structures can further include first control gate interconnect lines 194 which are electrically shorted to the first control gate contact via structures 84 and to the first electrically conductive layers 146 (e.g., select gate electrodes and/or control gate electrodes). The first control gate interconnect lines 194 can be parallel among one another. In one embodiment, the first control gate interconnect lines 194 can be parallel to the second horizontal direction hd2, and perpendicular to the first horizontal direction hd1. In FIG. 6A, line 194 is shorted to the top three electrically conductive layers 146D which function as drain side select gates of the memory device out of the set of first electrically conductive layers 146. The inter-tier interconnect structures can further include additional inter-tier interconnect structures (not shown) that are electrically shorted to the first source contact via structures 76, which can be employed to provide vertical electrical connections between the first source contact via structures 76 and second source contact via structures to be subsequently formed in a second tier. Such additional inter-tier interconnect structures can be formed, for example, within areas that coincide with, or are subsets of, the areas of the electrically shorted to the first source contact via structures 76, using any suitable interconnections such as shunt lines (not shown for clarity) which extend parallel to the bit lines.

Referring to FIGS. 7A-7E, a second tier 200 can be formed over the inter-tier dielectric material layer 1010 and the inter-tier interconnect structures embedded therein. At least one second tier base dielectric layer 190 can be formed over the inter-tier dielectric material layer 1010, for example, by chemical vapor deposition or spin coating. The at least one second tier base dielectric layer 190 is at least one dielectric material layer, and includes a dielectric material such as silicon oxide, organosilicate glass, and silicon nitride. In one embodiment, the at least one second tier base dielectric layer 190 can include at least a silicon oxide layer. The thickness of the at least one second tier base dielectric layer 190 can be in a range from 100 nm to 1,000 nm, although lesser and greater thicknesses can also be employed.

Via cavities are formed through the at least one second tier base dielectric layer 190 by a combination of lithographic methods and at least one anisotropic etch. For example, a photoresist layer can be applied and patterned over the at least one second tier base dielectric layer 190 to form openings therein, and the pattern of the opening can be transferred through the at least one second tier base dielectric layer 190 by an anisotropic etch to physically expose top surfaces of the inter-tier interconnect structures. The photoresist layer can be subsequently removed, for example, by ashing.

The via cavities can be formed in areas of the device region 100 in which second memory stack structures 255 are subsequently formed, and in areas in which additional second tier base interconnect structures (not shown) are to be formed in the contact regions 300. In one embodiment, the via cavities formed in the device region 100 can have the same pattern as the pattern of the second memory stack structures 255 to be subsequently formed. In one embodiment, the via cavities formed in the device region 100 can have the same pattern as the pattern of the first memory stack structures 155 in the first tier.

At least one conductive material can be deposited in the via cavities to form second tier base contact via structures, which can include second drain-side interconnect structures 189. For example, the second drain-side interconnect structures 189 can include at least one vertically extending via structure that provides electrical connection to second-tier drain regions 163 to be subsequently formed. The second drain-side interconnect structures 189 can include at least one metallic material, which can be, for example, a combination of a metallic liner (such as a metal nitride layer or a metal carbide layer) and a metal fill portion (such as tungsten, cobalt, copper, or aluminum). In one embodiment, the second-drain side interconnect structures 189 can be vertically recessed such that the top surfaces of the second-drain side interconnect structures 189 are recessed below the topmost surface of the at least one second tier base dielectric layer 190. The second drain-side interconnect structures 189 are formed on the bit lines 198, and in lower portions of the via cavities.

A second-tier drain region 163 can be formed over each second drain-side interconnect structure 189. Each second-tier drain region 163 is a second-tier bottom active region, i.e., a bottom active region of a vertical field effect transistor located within the second tier. The second-tier drain regions 163 can be formed, for example, by depositing a doped semiconductor material (such as doped polysilicon) within each recess overlying the second drain-side interconnect structures 189. The semiconductor material is deposited on top surfaces of the second drain-side interconnect structures 189. In one embodiment, an optional metal-semiconductor alloy region 164 can be formed by reaction of the semiconductor material of a lower portion of a second-tier drain region 163 and an underlying second drain-side interconnect structure 189. In this case, after annealing the structure, lower portions of the semiconductor material react with upper portions of the second drain-side interconnect structures 189 to form the metal-semiconductor alloy regions 164 (e.g., metal silicide regions, such as tungsten or cobalt silicide). Each unreacted upper portion of the semiconductor material constitutes one of the second-tier drain regions 163. The bit lines 198 are electrically shorted to respective second-tier drain regions 163.

A second alternating stack of second insulating layers 232 and second spacer material layers can be formed. The second spacer material layers can include second electrically conductive layers 246, or can include second sacrificial material layers that are subsequently replaced with second electrically conductive layers 246. In one embodiment, the second insulating layers 232 can have the same composition and thicknesses as the first insulating layers 132. In one embodiment, the second spacer material layers can have the same composition and thicknesses as the first spacer material layers. In one embodiment, the same set of processing steps can be employed to form the second alternating stack of second insulating layers 232 and second spacer material layers as the first alternating stack of the first insulating layers 132 and the first spacer material layers.

Subsequently, at least one second tier insulating cap layer 210 can be formed over the second alternating stack of the second insulating layers 232 and the second spacer material layers. The at least one second tier insulating cap layer 210 includes at least one dielectric material such as silicon oxide, and can be formed, for example, by chemical vapor deposition and/or spin coating.

Second memory openings can be formed through the at least one second tier insulating cap layer 210 and the second alternating stack of the second insulating layers 232 and the second spacer material layers. The processing steps employed to form the second memory openings can be the same as the processing steps employed to form the first memory openings. The locations of the second memory openings can be selected such that the areas of the second memory openings overlaps with the areas of the second drain-side interconnect structures 189. A second-tier drain region 163 can be physically exposed at the bottom of each second memory opening.

Second memory stack structures 255 can be formed in the second memory openings. Each second memory stack structure 255 can include a memory film 250 and a second semiconductor channel 260. Each memory film 250 can include from outside to inside at least one blocking dielectric, a memory material layer, and a tunneling dielectric. Each second semiconductor channel 260 includes at least one semiconductor material layer that is employed as a vertical portion of a semiconductor channel, and can include an outer semiconductor material layer and an inner semiconductor material layer. The second semiconductor channels 260 are formed over the second drain-side interconnect structures 189. A dielectric core 262 can be formed within a cavity in each second semiconductor channel 260, for example, by deposition and recessing of a dielectric material. A second-tier source region 211 can be formed in an upper portion of each second memory opening such that the second tier source regions 211 contact upper portions of the second semiconductor channels 260. Each second-tier source region 211 can be formed directly on an upper end of a respective second semiconductor channel 260. Each second-tier source region 211 is a second-tier top active region, i.e., a top active region located within the second tier.

In one embodiment, the at least one second tier insulating cap layer 210 and the second alternating stack can be removed from the peripheral device region 200, for example, by a masked etch process. In addition, a stepped cavity can be formed within the contact region 300 by patterning a portion of the second alternating stack. The stepped cavity can have various stepped surfaces such that the horizontal cross-sectional shape of the stepped cavity changes in steps as a function of the vertical distance from the top surface of the substrate semiconductor layer 10. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. After formation of all stepped surfaces, mask material layers employed to form the stepped surfaces can be removed, for example, by ashing. Multiple photoresist layers and/or multiple etch processes can be employed to form the stepped surfaces.

A dielectric material such as silicon oxide is deposited in the stepped cavity and over the peripheral devices 210 in the peripheral device region 200. Excess portions of the deposited dielectric material can be removed from above the top surface of the at least one second tier insulating cap layer 210, for example, by chemical mechanical planarization (CMP). The remaining portion of the deposited dielectric material filling the stepped cavity in the contact region 300 and overlying the inter-tier dielectric material layer 1010 in the peripheral device region 200 constitutes a second retro-stepped dielectric material portion 265. If silicon oxide is employed as the dielectric material, the silicon oxide of the second retro-stepped dielectric material portion 265 may, or may not, be doped with dopants such as B, P, and/or F. The top surface of the second retro-stepped dielectric material portion 265 can be coplanar with the top surface of the at least one second tier insulating cap layer 210.

If the second spacer material layers are second sacrificial material layers, second dielectric support pillars 7Q may be optionally formed through the second retro-stepped dielectric material portion 265 and/or through the second alternating stack of the second insulating layers 232 and the second spacer material layers. In one embodiment, the second dielectric support pillars 7Q can be formed in the contact region 300, which is located adjacent to the device region 100. The second dielectric support pillars 7Q can be formed, for example, by forming an opening extending through the second retro-stepped dielectric material portion 265 and/or through the second alternating stack and to the at least one second tier base dielectric layer 190, and by filling the opening with a dielectric material that is resistant to the etch chemistry to be employed to remove the second sacrificial material layers.

In one embodiment, the second dielectric support pillars 7Q can include silicon oxide and/or a dielectric metal oxide such as aluminum oxide. In one embodiment, the portion of the dielectric material that is deposited over the at least one insulating cap layer 210 concurrently with deposition of the second dielectric support pillars 7Q can be present over the at least one second tier insulating cap layer 210 as an additional insulating cap layer.

A photoresist layer is applied and patterned to form openings in areas that overlie the first source contact via structures 76. Second backside contact trenches can be formed between each neighboring pair of clusters of the second memory stack structures 255 by transferring the pattern of the openings in the photoresist layer through the at least one second tier insulating cap layer 210, the second retro-stepped dielectric material portion 265, and the second alternating stack. Top surface of inter-tier interconnect structures can be physically exposed at the bottom of the second backside contact trenches. In one embodiment, each second backside contact trench can extend along the second horizontal direction hd2 so that clusters of the second memory stack structures 255 are laterally spaced along the first horizontal direction hd1. Each cluster of second memory stack structures 255 in conjunction with the portions of the second alternating stack laterally surround the cluster constitutes a memory block. Each memory block is laterally spaced from one another by the second backside contact trenches.

In case the second spacer material layers are second sacrificial material layers, an etchant that selectively etches the second material of the second sacrificial material layers with respect to the second material of the second insulating layers 232 can be introduced into the second backside contact trenches, for example, employing an etch process. Second backside recesses are formed in volumes from which the second sacrificial material layers are removed. The removal of the second sacrificial material layers can be selective to the material of the second insulating layers 232, the material of the second dielectric support pillars 7Q, the material of the second retro-stepped dielectric material portion 265, and the material of the outermost layer of the second memory films 250. In one embodiment, the second sacrificial material layers can include silicon nitride, and the materials of the second insulating layers 232, the second dielectric support pillars 7Q, and the second retro-stepped dielectric material portion 265 can be selected from silicon oxide and dielectric metal oxides. In another embodiment, the second sacrificial material layers can include a semiconductor material such as polysilicon, and the materials of the second insulating layers 232, the second dielectric support pillars 7Q, and the second retro-stepped dielectric material portion 265 can be selected from silicon oxide, silicon nitride, and dielectric metal oxides.

The etch process that removes the second material selective to the second material and the outermost layer of the second memory films 250 can be a wet etch process employing a wet etch solution, or can be a gas phase (dry) etch process in which the etchant is introduced in a vapor phase into the second backside contact trenches. For example, if the second sacrificial material layers include silicon nitride, the etch process can be a wet etch process in which the exemplary structure is immersed within a wet etch tank including phosphoric acid, which etches silicon nitride selective to silicon oxide, silicon, and various other materials employed in the art. The second dielectric support pillars 7Q, the second retro-stepped dielectric material portion 265, and the second memory stack structures 255 provide structural support while the second backside recesses are present within volumes previously occupied by the second sacrificial material layers.

Each second backside recess can be a laterally extending cavity having a lateral dimension that is greater than the vertical extent of the cavity. In other words, the lateral dimension of each second backside recess can be greater than the height of the second backside recess. A plurality of second backside recesses can be formed in the volumes from which the second material of the second sacrificial material layers is removed. The second memory openings in which the second memory stack structures 255 are formed are herein referred to as front side recesses or front side cavities in contrast with the second backside recesses. In one embodiment, the device region 100 comprises an array of monolithic three-dimensional NAND strings having a plurality of device levels disposed above the inter-tier dielectric material layer 1010. In this case, each second backside recess can define a space for receiving a respective word line of the array of monolithic three-dimensional NAND strings.

Each of the plurality of second backside recesses can extend substantially parallel to the top surface of the substrate semiconductor layer 10. A second backside recess can be vertically bounded by a top surface of an underlying second insulating layer 232 and a bottom surface of an overlying second insulating layer 232. In one embodiment, each second backside recess can have a uniform height throughout. Optionally, a backside blocking dielectric layer can be formed in the second backside recesses.

A backside blocking dielectric layer (not shown) can be optionally formed. The backside blocking dielectric layer, if present, comprises a dielectric material that functions as a control gate dielectric for the control gates to be subsequently formed in the second backside recesses. In case at least one blocking dielectric is present within each second memory stack structure 255, the backside blocking dielectric layer is optional. In case a blocking dielectric is not present in the second memory stack structures 255, the backside blocking dielectric layer is present.

At least one metallic material can be deposited in the plurality of second backside recesses, on the sidewalls of the second backside contact trenches, and over the top surface of the at least one second tier insulating cap layer 210. The processing steps employed to deposit the at least one metallic material in the second backside recesses can be the same as the processing steps employed to form the first electrically conductive layers 146.

A plurality of second electrically conductive layers 246 can be formed in the plurality of second backside recesses, and a contiguous metallic material layer (not shown) can be formed on the sidewalls of each second backside contact trench and over the at least one second tier insulating cap layer 210. Thus, each second sacrificial material layer can be replaced with a second electrically conductive layer 246. A backside cavity is present in the portion of each second backside contact trench that is not filled with the backside blocking dielectric layer and the contiguous metallic material layer.

The deposited metallic material of the contiguous metallic material layer is subsequently etched back from the sidewalls of each second backside contact trench and from above the at least one second tier insulating cap layer 210, for example, by an isotropic etch. Each remaining portion of the deposited metallic material in the second backside recesses constitutes a second electrically conductive layer 246. Each second electrically conductive layer 246 can be a conductive line structure.

A subset of the second electrically conductive layers 246 can function as a combination of a plurality of control gate electrodes located at a same level and a word line electrically interconnecting, i.e., electrically shorting, the plurality of control gate electrodes located at the same level. The plurality of control gate electrodes within the second electrically conductive layers 246 are the control gate electrodes and select gate electrodes for the vertical memory devices including the second memory stack structures 255.

Second insulating spacers 274 can be formed over the sidewalls of the second backside contact trenches, for example, by deposition and an anisotropic etch of a conformal dielectric material layer. Photolithographic processes and anisotropic etch processes can be repeatedly employed to form various via cavities that extend from the top surface of the at least one second tier insulating cap layer 210 to various conductive elements within the second tier 2000. For example, control gate via cavities can be formed over the stepped surfaces underlying the second retro-stepped dielectric material portion 265.

At least one conductive material, which can include a metallic liner (such as TiN, TaN, or WN) and a conductive fill material (such as W, Cu, Al, Co, Ru, or a combination thereof), can be deposited in the various via cavities, and can be subsequently planarized, for example, by chemical mechanical planarization (CMP). Remaining portions of the at least one conductive material filling the various via cavities constitute various contact via structures. The various contact via structures can include, for example, second backside contact via structures 276 filling the second backside contact trenches, and second control gate contact via structures 284 that contact the second electrically conductive layers 246 (e.g., the top three select gate electrodes). The second source contact via structures 276 are formed through the second alternating stack (232, 246) and the second retro-stepped dielectric material portion 265.

Source lines 230 can be formed over, and optionally on, the second-tier source regions 211. Each source line 230 can be electrically shorted to a subset of the second-tier source regions 211, and can be electrically shorted to one or more of the first-tier source regions 61 through the first and second source contact via structures (76, 276) and a common shunt line (not shown for clarity). In one embodiment, each source line 230 may include a metallic barrier liner 230S (e.g., tungsten silicide or titanium nitride) and a metallic fill portion 230M (e.g., tungsten).

A second tier cap dielectric layer 220 can be formed at the level of, and/or above, the source lines 230. The second tier cap dielectric layer 230 includes a dielectric material such as silicon oxide. Additional interconnect structures can be formed in the second tier cap dielectric layer 220 as needed. In one embodiment, second control gate interconnect lines 294 can be formed in the second tier cap dielectric layer 220. The second control gate interconnect lines 294 can be electrically shorted to the second control gate contact via structures 284 and to the second electrically conductive layers 246. The second control gate interconnect lines 294 can be parallel among one another. In one embodiment, the second control gate interconnect lines 294 can be parallel to the second horizontal direction hd2, and perpendicular to the first horizontal direction hd1, where the first and second horizontal directions (hd1, hd2) are illustrated in FIG. 5B.

Figure 7C:
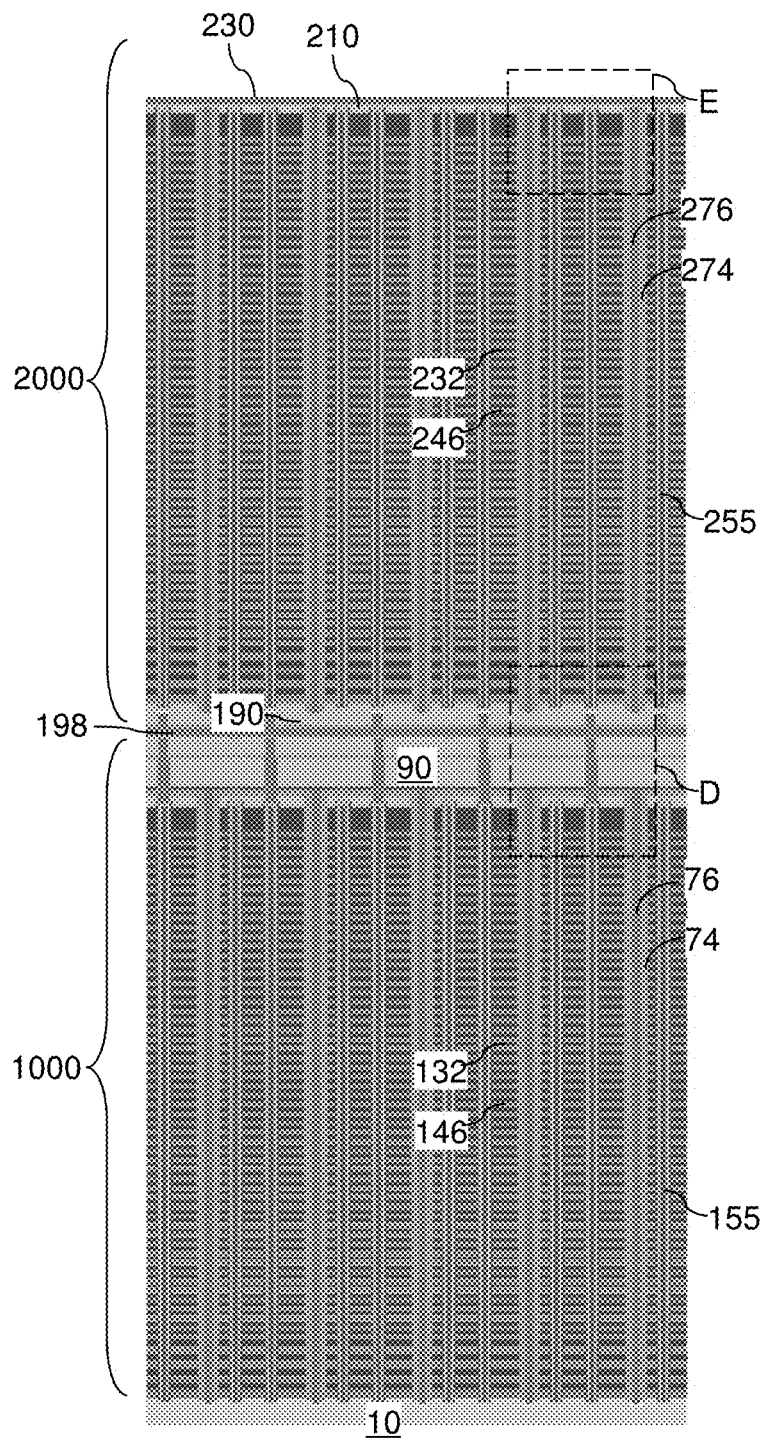
FIG. 7C is a vertical cross-sectional view of the device region of the exemplary structure of FIG. 7A along a second vertical plane.
Figure 7F:
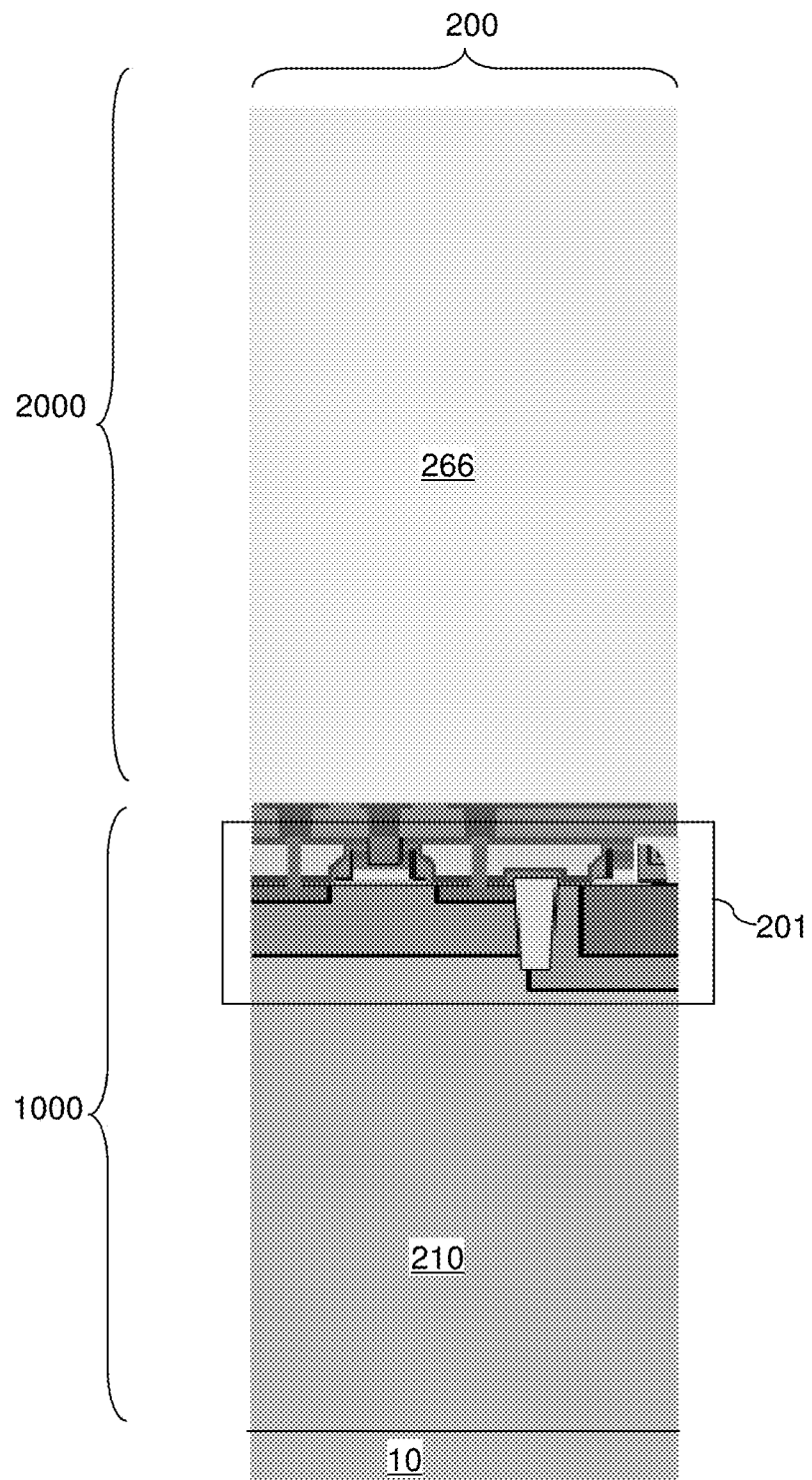
FIG. 7F is a vertical cross-sectional view of a peripheral device region of the exemplary structure of FIG. 7A.

Referring to FIG. 7F, the first and second retro-stepped dielectric material portions (165, 265) and additional dielectric material layers located in the peripheral device region 200 can be removed in the peripheral device region 200 (see FIG. 5B) while protecting the device region 100 and the contact region 300 of the exemplary structure with a patterned masking layer (which can be a patterned photoresist layer). An epitaxial pedestal 210 including a single crystalline semiconductor material (e.g., single crystal silicon) in epitaxial alignment and contact with the single crystalline semiconductor material of the substrate semiconductor layer 10 can be formed by a selective epitaxy process. The height of the epitaxial pedestal 210 can be adjusted as needed. The top surface of the epitaxial pedestal 210 may be coplanar with the top surface of the second tier 2000, may be located between the top surface and the bottom surface of the second tier 2000, may be located at the level of the inter-stack dielectric material layer 1010, or may be located at, or below, the top surface of the first tier 1000. Peripheral semiconductor devices 201 can be formed on, and/or in, the epitaxial pedestal 210. The peripheral semiconductor devices can include transistors (e.g., FET, CMOS, etc,) of driver circuits for the memory devices that are present in the device region 100. If the top surface of the epitaxial pedestal 210 is substantially recessed below the top surface of the second tier 2000, a dielectric fill material portion 266 can be formed over the epitaxial pedestal 210 as needed. Thus, the driver circuits may be formed in or on a silicon substrate. In an alternative embodiment, rather than epitaxially growing the pedestal 210, the pedestal may be formed by etching a deep recesses in the device region 100 and contact region 300 of the substrate semiconductor layer 10 while not etching layer 10 in the peripheral region 200. The remaining portion of layer 10 in region 200 forms the pedestal 210, while the stacks are formed in the recess in regions 100 and 300.

Figure 8:
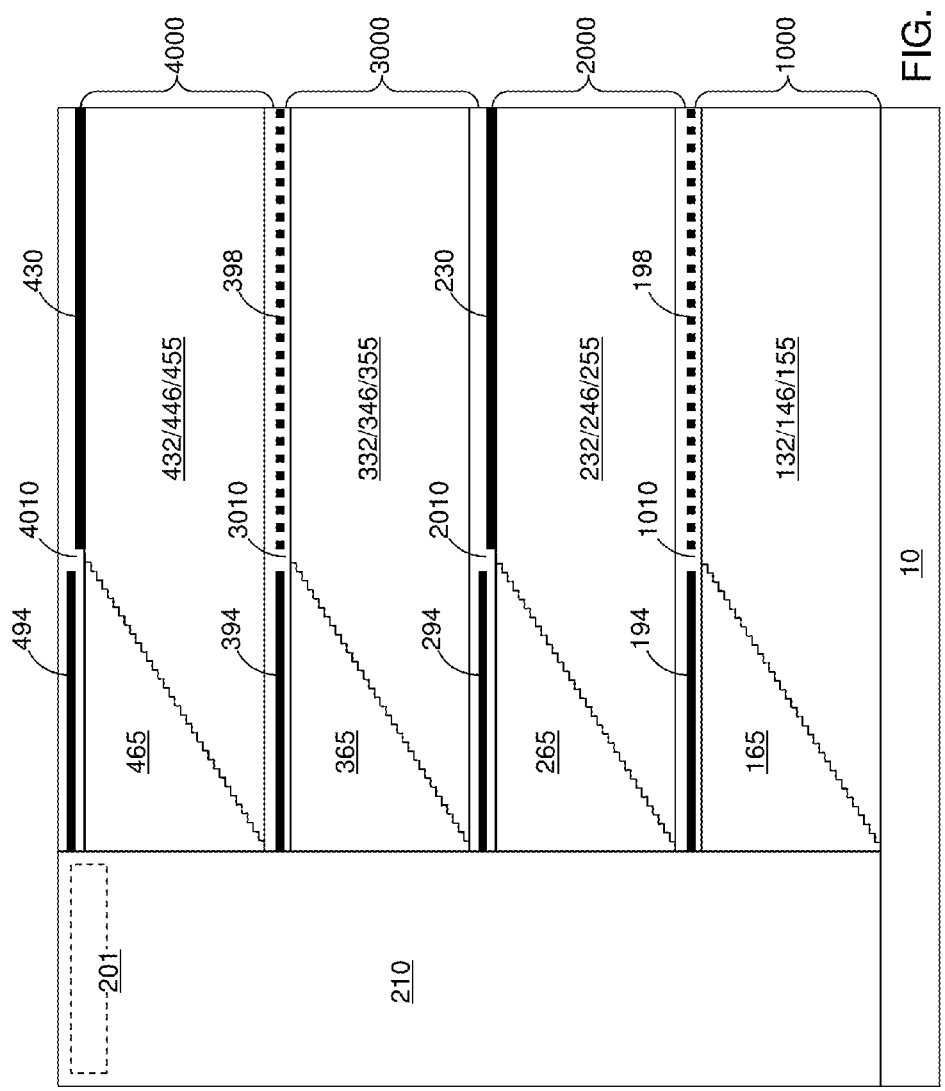
FIG. 8 is a vertical cross-sectional view of another exemplary structure including more than two tiers according to an embodiment of the present disclosure.

Referring to FIG. 8, another exemplary structure is illustrated, which can be derived from the exemplary structure of FIGS. 7A-7F by forming additional tiers (3000, 4000). The additional tiers (3000, 400) can be formed over the second tier 200 with additional inter-tier dielectric material layers (2010, 3010, 4010). The second control gate interconnect lines 294 may be formed within a second inter-tier dielectric material layer 2010. For example, a third tier 3000 and a fourth tier 4000 cam be formed over the second tier 2000. The third tier 3000 comprises a third alternating stack of third insulating layers 332 and third electrically conductive layers 346, third memory stack structures 355, and a third retro-stepped dielectric material portion 365 overlying stepped surfaces of the third alternating stack (332, 346). In this case, each source line 230 can be electrically shorted to a subset of second-tier source regions 211 contacting an upper end of a respective second semiconductor channel 260 and to a subset of third source regions contacting a lower end of a respective third semiconductor channel in the third tier 3000. The fourth tier 4000 comprises a fourth alternating stack of fourth insulating layers 432 and fourth electrically conductive layers 446, fourth memory stack structures 455, and a fourth retro-stepped dielectric material portion 465 overlying stepped surfaces of the fourth alternating stack (432, 446).

A second set of bit line 398 can be provided between the third tier 3000 and the fourth tier 4000 with the same type of electrical connections to respective electrical components in the third tier 3000 and the fourth tier 4000 as the electrical connections between the bit lines 198 and the respective electrical components in the first tier 1000 and the second tier 2000. A second set of source lines 430 can be provided in the fourth inter-tier dielectric material layer 4010 (which can be replaced with a topmost dielectric material layer if only up to four tiers are constructed) with the same type of electrical connections to the respective electrical components in the third tier 3000 and the fourth tier 4000 as the electrical connections for the source lines 230 to the respective electrical components in the first and second tiers (1000, 2000). Third control gate interconnect lines 394 and fourth control gate interconnect lines 494 can be employed to provide electrical connections to the various word lines in the third tier 3000 and the fourth tier 4000, respectively.

In one embodiment, the epitaxial pedestal 210 can vertically extend between the substrate semiconductor layer 10 and a topmost tier within the multi-tier memory device. In one embodiment, semiconductor devices 201 of the driver circuit can be formed at the level of the topmost tier.

The exemplary structures of the present disclosure can include a multi-tier memory device comprising: a first tier 1000 overlying a substrate (e.g., overlying the substrate semiconductor layer 10) and comprising a first alternating stack of first insulating layers 132 and first electrically conductive layers 146, and first vertical transistors (61, 13, 11, 60, 63, 50, 146) each including a first semiconductor channel 60 and a first-tier top active region 63 that contacts an upper end of the first semiconductor channel 60; bit lines 198 overlying the first tier 1000 and electrically shorted to respective first-tier top active regions 63; and a second tier 2000 overlying the bit lines 198 and comprising a second alternating stack of second insulating layers 232 and second electrically conductive layers 246, and second vertical transistors (163, 260, 211, 250, 246) each including a second semiconductor channel 260 and a second-tier bottom active region 263 that contacts a lower end of the second semiconductor channel 260. The bit lines 198 are electrically shorted to respective second-tier bottom active regions 263.

The exemplary structures of the present disclosure can include a multi-tier memory device comprising: a first tier 1000 overlying a substrate (a lower portion of the substrate semiconductor layer 10) and comprising a first alternating stack of first insulating layers 132 and first electrically conductive layers 146, first memory stack structures 155 extending through the first alternating stack (132, 146) and each including a first semiconductor channel 60, and first-tier drain regions 63 contacting an upper end of each first semiconductor channel 60; bit lines 198 overlying the first tier 1000 and electrically shorted to respective first-tier drain regions 63; and a second tier 2000 overlying the bit lines 198 and comprising a second alternating stack of second insulating layers 232 and second electrically conductive layers 246, second memory stack structures 255 extending through the second alternating stack (232, 246) and each including a second semiconductor channel 260, and second-tier drain regions 163 contacting a lower end of each second semiconductor channel 260. The bit lines 198 are electrically shorted to respective second-tier drain regions 163.

In one embodiment, each bit line 198 can be electrically shorted to respective first-tier drain regions 63 through at least one first drain-side interconnect structure (88, 89) extending through a dielectric material layer 90 in the first tier 1000; and is electrically shorted to respective second-tier drain regions 163 through at least one second drain-side interconnect structure 189 extending through another dielectric material layer 190 overlying the bit lines 198. In one embodiment, sidewalls of the second-tier drain regions 163 can contact a dielectric material layer 190. In one embodiment, each of the second-tier drain regions 163 can comprise a doped semiconductor region that contacts an underlying metal-semiconductor alloy region.

In one embodiment, the substrate can comprise a semiconductor substrate including a substrate semiconductor layer 10, and the semiconductor substrate can comprise first-tier source regions 61 and horizontal channels 13 extending between a respective first-tier source region 61 and a respective subset of first semiconductor channels 60, as shown in FIG. 5A. In one embodiment, the second tier 2000 comprises second-tier source regions 211 contacting an upper end of a respective second semiconductor channel 260. In one embodiment, the second tier 2000 comprises a source line 230 that is electrically shorted to the second-tier source regions 211. In one embodiment, first source contact via structures 76 can extend through the first alternating stack (132, 146) and can contact the first-tier source regions 61. Second source contact via structures 276 can extend through the second alternating stack (232, 246) and can contact the source line 230. In one embodiment, interconnect structures can be located between the first alternating stack (132, 146) and the second alternating stack (232, 246), and can electrically short respective pairs of the first source contact via structures 76 and the second source contact via structures 276.

In one embodiment, each of first and second memory stack structures can comprise, from outside to inside: at least one blocking dielectric, a memory material layer, a tunneling dielectric, and one of a first semiconductor channel and a second semiconductor channel. The multi-tier memory device can further comprise a first retro-stepped dielectric material portion 165 overlying first stepped surfaces of the first alternating stack (132, 146), and a second retro-stepped dielectric material portion 265 overlying second stepped surfaces of the second alternating stack (232, 246). In one embodiment, the first stepped surfaces and the second stepped surfaces can be located within a same area, and overlie or underlie each other.

In one embodiment, the multi-tier memory device comprises a vertical NAND device located over the substrate. The first and second electrically conductive layers can comprise, or are electrically connected to, a respective word line of the vertical NAND device. The substrate can comprise a silicon substrate. The vertical NAND device can comprises an array of monolithic three-dimensional NAND strings over the silicon substrate. At least one memory cell in a first device level of the array of monolithic three-dimensional NAND strings can be located over another memory cell in a second device level of the array of monolithic three-dimensional NAND strings. The array of monolithic three-dimensional NAND strings can comprise a plurality of semiconductor channels including the first and second semiconductor channels. At least one end portion of each of the plurality of semiconductor channels can extend substantially perpendicular to a top surface of the substrate. The array of monolithic three-dimensional NAND strings can further comprise a plurality of charge storage elements. Each charge storage element can be located adjacent to a respective one of the plurality of semiconductor channels. In one embodiment, each charge element can be a portion of a memory material layer that is adjacent to a control gate electrode. The array of monolithic three-dimensional NAND strings can further comprise a plurality of control gate electrodes having a strip shape extending substantially parallel to the top surface of the substrate. The plurality of control gate electrodes can comprise at least a first control gate electrode located in the first device level and a second control gate electrode located in the second device level.

Figure 9:
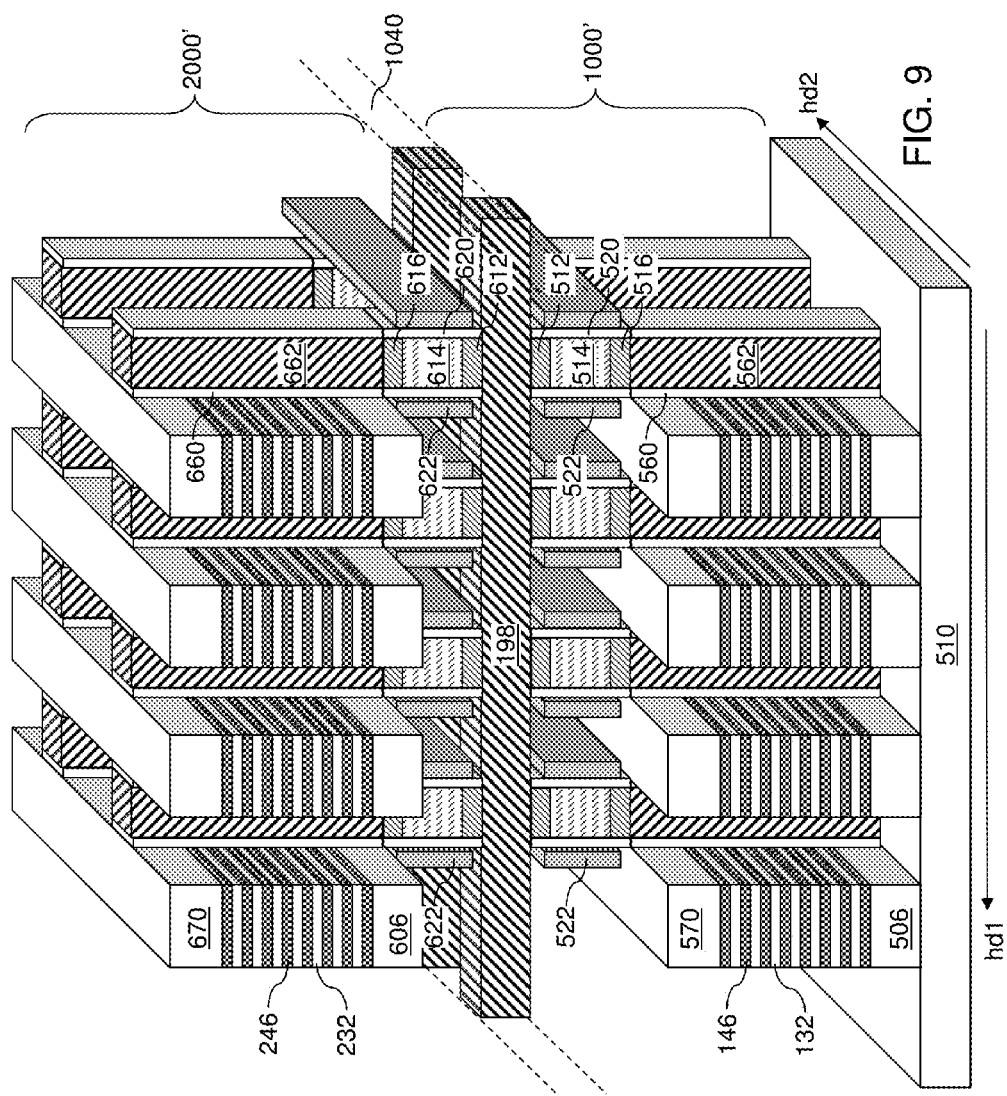
FIG. 9 is a perspective view of yet another exemplary structure according to an embodiment of the present disclosure.

Referring to FIG. 9, anther exemplary structure according to an embodiment of the present disclosure is illustrated, which includes a resistive random access memory (ReRAM) device. The exemplary structure includes a substrate 510, which includes an insulating layer at least at an upper portion thereof. A first tier base insulating layer 506, a first alternating stack (132, 146) of first insulating layers 132 and first electrically conductive layers 146, and a first tier cap insulating layer 570 can be sequentially formed as blanket (unpatterned) layers, and can be subsequently patterned to form first word line stacks (506, 132, 146, 570). Each first word line stack includes an alternating plurality of first insulating layers 132 and first electrically conductive layers 146 which function as word lines. The first word line stacks (506, 132, 146, 570) extend along the second horizontal direction hd2, and are laterally spaced from one another along the first horizontal direction hd1 that can be perpendicular to the second horizontal direction hd2.

A first resistive memory material layer 560 can be formed on each sidewall of the first word line stacks (506, 132, 146, 570) by deposition of a conformal resistive memory material layer and an anisotropic etch. The first resistive memory material layers 560 includes a resistive memory material, which is a material that can change the resistivity by formation of removal of conductive filaments based on electrical bias applied thereto. Any of the first resistive memory materials known in the art can be employed for the resistive memory material layer 560. For example, layer 560 may comprise a chalcogenide material or a metal oxide (e.g., nickel oxide or copper oxide) material as the memory storage element material. A small region of the memory material layer between an intersecting local bit line 562 and word line 146 is controllably alternated between more conductive (set) and less conductive (reset) states by appropriate voltages applied to the intersecting lines.

First vertical local bit lines (e.g., local bit line pillar structures) 562 can be formed, for example, by deposition of at least one conductive material within the trenches between the stacks lined by the resistive memory material layers 560, and subsequent patterning of the at least one conductive material such that remaining portions of the at least one conductive material form a two-dimensional array of vertically extending pillars. The first local bit line pillar structures 562 are laterally spaced apart along the second horizontal direction hd2 by cavities, and are laterally spaced apart along the first horizontal direction hd1 by the first word line stacks (506, 132, 146, 570). A dielectric material can be deposited within the cavities between the first local bit line pillar structures 562 to provide electrical isolation among the first local bit line pillar structures 562.

First access transistors are subsequently formed on each first local bit line pillar structure 562. Each first access transistor can be a vertical field effect transistor, and can include a first bottom active region 516 (which can be a first-tier source region within a first tier 1000'), a first semiconductor channel 514, a first top active region 512 (which can be a first-tier drain region), a portion of a first gate dielectric layer 520 (i.e., a gate dielectric layer located within the first tier 1000'), and a portion of a first gate electrode layer 522. The first semiconductor channels 514 are configured to conduct electrical current along the vertical direction. The first gate electrode layers 522 can laterally extend along the lengthwise direction of the first word line stacks (506, 132, 146, 570), which can be along the second horizontal direction hd2 (i.e., word line directions). A first dielectric fill material layer (not illustrated) can be provided around the first access transistors to complete a first tier 1000'.

An inter-stack dielectric material layer 1040 can be formed over the first tier 1000'. Trenches can be formed in the inter-stack dielectric material layer 1040 to form bit lines 198, which can extend along a horizontal direction that is different from the second horizontal direction hd2 (which is the word line direction which extends lengthwise along the first word line stacks (506, 132, 146, 570)). Each bit line 198 is electrically shorted to a respective subset of the first top active regions 512 of the first access transistors. Additional interconnect structures (not shown) can be formed within the inter-stack dielectric material layer 1040, which can be employed to provide electrical connection between additional devices in the first tier 1000' and in the second tier 2000'.

Second access transistors are subsequently formed on bit line 198. Each second access transistor can be a vertical field effect transistor, and can include a second bottom active region 612 (which can be a second-tier source region within a second tier 2000'), a second semiconductor channel 614, a second top active region 615 (which can be a second-tier drain region), a portion of a second gate dielectric layer 620 (i.e., a gate dielectric layer located within the second tier 2000'), and a portion of a second gate electrode layer 622. The second semiconductor channels 614 are configured to conduct electrical current along the vertical direction. The second gate electrode layers 622 can laterally extend along the lengthwise direction of second word line stacks (670, 232, 246, 606) to be subsequently formed, which can be along the second horizontal direction hd2. A second dielectric fill material layer (not illustrated) can be provided around the second access transistors.

A second tier base insulating layer 606, a second alternating stack (232, 246) of second insulating layers 232 and second electrically conductive layers 246, and a second tier cap insulating layer 670 can be sequentially formed as blanket (unpatterned) layers, and can be subsequently patterned to form second word line stacks (606, 232, 246, 670). Each second word line stack includes an alternating plurality of second insulating layers 232 and second electrically conductive layers 246 (i.e., second word lines). In one embodiment, the second word line stacks (606, 232, 246, 670) extend along the second horizontal direction hd2, and are laterally spaced from one another along the first horizontal direction hd1 that can be perpendicular to the first horizontal direction hd1.

A second resist memory material layer 660 can be formed on each sidewall of the second word line stacks (606, 232, 246, 670) by deposition of a conformal resistive memory material layer and an anisotropic etch. The second resistive memory material layers 660 includes a resistive memory material, which is a material that can change the resistivity by formation of removal of conductive filaments based on electrical bias applied thereto. Any of the resistive memory materials known in the art can be employed for the second resistive memory material layer 660.

Second local bit line pillar structures 662 (e.g., second vertical local bit lines) can be formed, for example, by deposition of at least one conductive material within the trenches lined by the resistive memory material layers 660, and subsequent patterning of the at least one conductive material such that remaining portions of the at least one conductive material form a two-dimensional array of vertically extending pillars. The second local bit line pillar structures 662 are laterally spaced apart along the second horizontal direction hd2 by cavities, and are laterally spaced apart along the first horizontal direction hd1 by the second word line stacks (606, 232, 246, 670). A dielectric material can be deposited within the cavities between the second local bit line pillar structures 662 to provide electrical isolation among the second local bit line pillar structures 662. Thus, the first and second access transistors in the first and second tiers are electrically connected to a shared bit line 198 located between the tiers.

The exemplary structure comprises a multi-tier memory device, which includes a first tier 1000' overlying a substrate 510 and comprising a first alternating stack of first insulating layers 132 and first electrically conductive layers 146, and first vertical transistors (512, 514, 516, 520, 522) each including a first semiconductor channel 514 and a first-tier top active region 512 that contacts an upper end of the first semiconductor channel 514, bit lines 198 overlying the first tier 1000' and electrically shorted to respective first-tier top active regions 512; and a second tier 2000' overlying the bit lines 198 and comprising a second alternating stack of second insulating layers 232 and second electrically conductive layers 246, and second vertical transistors (612, 614, 616, 620, 622) each including a second semiconductor channel 614 and a second-tier bottom active region 612 that contacts a lower end of the second semiconductor channel 614. The bit lines 198 are electrically shorted to respective second-tier bottom active regions 612.

In one embodiment, each first semiconductor channel 514 is located above a respective first local bit line pillar structure 562 that extends parallel to the stacking direction of the first alternating stack (132, 146), and each second semiconductor channel 614 is located below a respective second local bit line pillar structure 662 that extends parallel to the stacking direction of the second alternating stack (232, 246). A first resistive memory material layer 560 is located on a sidewall of the first alternating stack (132, 146), and a second resistive memory material layer 660 is located on a sidewall of the second alternating stack (232, 246).

In one embodiment, each first vertical transistor (512, 514, 516, 520, 522) can include a first-tier bottom active region 516 that is electrically shorted to a respective first local bit line pillar structure 562, and each second vertical transistor (612, 614, 616, 620, 622) can include a second-tier top active region 616 that is electrically shorted to a respective second local bit line pillar structure 662. In one embodiment, the multi-tier memory device can be a resistive random access memory device in which the first and second electrically conductive layers (146, 246) are word lines for accessing a resistive memory element within a three-dimensional array of resistive memory elements (which are portions of the first and second resistive memory material layers (560, 660)).

In the embodiments of the present disclosure, adjacent tiers of the memory device (e.g., three dimensional NAND or ReRAM) share a common bit line or source line. The shared line configuration provides a device with an increased number of word lines and increased device density (e.g., double density for two tiers) without significantly limiting channel mobility in NAND devices. In other words, as the number of word lines increases significantly, the channel length also increases (i.e., since the memory hole height increases through the word line stack). When the channel length increases significantly, the channel material may become a limiting factor with limited mobility due to the increased channel length. Thus, as the number of word lines increases, NAND string current may decrease until reaching a limit. Thus, a three dimensional 3D NAND device may not be able to keep scaling by increasing the number of word lines. In this case, the shared line configuration permits the channel length to be shortened by splitting a single long channel into two shorter channels located above and below the common line. This permits the three dimensional 3D NAND device to keep scaling by increasing the number of word lines. Furthermore, increases scaling increases cell leakage in the ReRAM device. The shared line configuration permits scaling of the ReRAM device (i.e., increase in number of stacked word lines) while controlling cell leakage.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A multi-tier memory device, comprising:
a first tier overlying a substrate and comprising a first alternating stack of first insulating layers and first electrically conductive layers, and first vertical transistors each including a first semiconductor channel and a first-tier top active region that contacts an upper end of the first semiconductor channel;
bit lines overlying the first tier and electrically shorted to respective first-tier top active regions; and
a second tier overlying the bit lines and comprising a second alternating stack of second insulating layers and second electrically conductive layers, and second vertical transistors each including a second semiconductor channel and a second-tier bottom active region that contacts a lower end of the second semiconductor channel,
wherein the bit lines are electrically shorted to respective second-tier bottom active regions.

2. The multi-tier memory device of claim 1, wherein:
each first semiconductor channel is located within a respective first memory stack structure that extends through the first alternating stack; and
each second semiconductor channel is located within a respective second memory stack structure that extends through the second alternating stack.

3. The multi-tier memory device of claim 2, wherein:
the first-tier top active regions are first-tier drain regions; and
the second-tier bottom active regions are second-tier drain regions.

4. The multi-tier memory device of claim 3, wherein:
each bit line is electrically shorted to respective first-tier drain regions through at least one first drain-side interconnect structure extending through a dielectric material layer in the first tier, and is electrically shorted to respective second-tier drain regions through at least one second drain-side interconnect structure extending through another dielectric material layer overlying the bit lines;
sidewalls of the second-tier drain regions contact a dielectric material layer; and

29 each of the second-tier drain regions comprises a doped semiconductor region that contacts an underlying metal-semiconductor alloy region.

5. The multi-tier memory device of claim 3, wherein:
the substrate comprises a substrate semiconductor layer;
the substrate semiconductor layer comprises first-tier source regions and horizontal channels extending between a respective first-tier source region and a respective subset of first semiconductor channels;
the second tier comprises second-tier source regions contacting an upper end of a respective second semiconductor channel; and
the second tier comprises a source line that is electrically shorted to the second-tier source regions.

6. The multi-tier memory device of claim 5, further comprising:
first source contact via structures extending through the first alternating stack and contacting the first-tier source regions;
second source contact via structures extending through the second alternating stack and contacting the source line; and
interconnect structures and electrically shorting respective pairs of the first source contact via structures and the second source contact via structures.

7. The multi-tier memory device of claim 2, wherein each of the first and second memory stack structures comprises, from outside to inside:
at least one blocking dielectric,
a memory material layer,
a tunneling dielectric, and
one of a first semiconductor channel and a second semiconductor channel.

8. The multi-tier memory device of claim 2, further comprising:
a third tier overlying the second tier and comprising a third alternating stack of third insulating layers and third electrically conductive layers, third memory stack structures extending through the third alternating stack and each including a third semiconductor channel, and third drain regions contacting an upper end of each third semiconductor channel; and
a source line located between the second tier and the third tier and electrically shorted to a subset of second-tier source regions contacting an upper end of a respective second semiconductor channel and to a subset of third source regions contacting a lower end of a respective third semiconductor channel.

9. The multi-tier memory device of claim 2, further comprising:
an epitaxial pedestal in epitaxial alignment with a semiconductor material layer within the substrate, vertically extending between the substrate and a topmost tier within the multi-tier memory device, and including peripheral semiconductor devices at a level of the topmost tier;
a first retro-stepped dielectric material portion overlying first stepped surfaces of the first alternating stack; and
a second retro-stepped dielectric material portion overlying second stepped surfaces of the second alternating stack.

10. The multi-tier memory device of claim 1, wherein the multi-tier memory device comprises a vertical NAND device located over the substrate.

30

11. The multi-tier memory device of claim 10, wherein:
the first and second electrically conductive layers comprise, or are electrically connected to, a respective word line of the vertical NAND device;
the substrate comprises a silicon substrate;
the vertical NAND device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings; and
the array of monolithic three-dimensional NAND strings comprises:
a plurality of semiconductor channels including the first and second semiconductor channels, wherein at least one end portion of each of the plurality of semiconductor channels extends substantially perpendicular to a top surface of the substrate;
a plurality of charge storage elements, each charge storage element located adjacent to a respective one of the plurality of semiconductor channels; and
a plurality of control gate electrodes having a strip shape extending substantially parallel to the top surface of the substrate, the plurality of control gate electrodes comprise at least a first control gate electrode located in the first device level and a second control gate electrode located in the second device level.

12. The multi-tier memory device of claim 1, further comprising:
a plurality of first local bit line pillar structures that extend parallel to a stacking direction of the first alternating stack and located below each respective first semiconductor channel;
a plurality of second local bit line pillar structures that extend parallel to a stacking direction of the second alternating stack and located above each respective second semiconductor channel;
a first resistive memory material layer located on a sidewall of the first alternating stack; and
a second resistive memory material layer located on a sidewall of the second alternating stack.

13. The multi-tier memory device of claim 12, wherein:
each first vertical transistor includes a first-tier bottom active region that is electrically shorted to a respective first local bit line pillar structure;
each second vertical transistor includes a second-tier top active region that is electrically shorted to a respective second local bit line pillar structure; and
the multi-tier memory device is a resistive random access memory device in which the first and second electrically conductive layers are word lines for accessing a resistive memory element within a three-dimensional array of resistive memory elements.

14. A method of manufacturing a multi-tier memory device, comprising:
forming a first tier over a substrate, the first tier comprising a first alternating stack of first insulating layers and first electrically conductive layers, and first vertical transistors each including a first semiconductor channel and a first-tier top active region that contacts an upper end of the first semiconductor channel;
forming bit lines over the first tier, wherein the bit lines are electrically shorted to respective first-tier top active regions; and forming a second tier over the bit lines, the second tier comprising a second alternating stack of second insulating layers and second electrically conductive layers, and second vertical transistors each including a second semiconductor channel and a second-tier bottom active region that contacts a lower end of the second semiconductor channel, wherein the bit lines are electrically shorted to respective second-tier bottom active regions.

15. The method of claim 14, further comprising:

forming first memory stack structures through the first alternating stack, wherein each first memory stack structure comprises a respective first semiconductor channel, and each first-tier top active region is a first-tier drain region; and forming second memory stack structure through the second alternating stack, wherein each second memory stack structure comprises a respective second semiconductor channel, and each second-tier bottom active region is a second-tier drain region.

16. The method of claim 15, further comprising:

forming an alternating plurality of first insulating layers and first spacer material layers to form the first alternating stack;

forming first memory stack structures through the first alternating stack;

replacing the first spacer material layers with first electrically conductive layers to form the first tier;

forming an alternating plurality of second insulating layers and second spacer material layers to form the second alternating stack;

forming second memory stack structures through the second alternating stack; and replacing the second spacer material layers with second electrically conductive layers to form the second tier.

17. The method of claim 15, further comprising:

forming at least one first tier cap dielectric layer over the first alternating stack;

forming first drain-side interconnect structures on the first-tier drain regions, wherein the first drain-side interconnect structures are formed through the at least one first tier cap dielectric layer;

forming the bit lines on the first drain-side interconnect structures;

forming at least one second tier base dielectric material layer over the bit lines; and forming second drain-side interconnect structures on the bit lines, wherein the second drain-side interconnect structures are formed through the at least one second tier base dielectric material layer, and wherein the second semiconductor channels are formed over the second drain-side interconnect structures.

18. The method of claim 17, wherein:

the second-tier drain regions are formed by forming via cavities in the at least another dielectric material layer and depositing a semiconductor material in the via cavities;

the second drain-side interconnect structures are formed in lower portions of the via cavities;

the semiconductor material is deposited on top surfaces of the second drain-side interconnect structures;

lower portions of the semiconductor material react with upper portions of the second drain-side interconnect structures to form metal-semiconductor alloy regions; and each unreacted upper portion of the semiconductor material constitutes one of the second-tier drain regions.

19. The method of claim 15, wherein:

the substrate is a semiconductor substrate including a semiconductor material layer;

the method further comprises forming first-tier source regions in or on the semiconductor material layer, wherein horizontal channels extending between a respective first-tier source region and a respective subset of first semiconductor channels is formed in the semiconductor material layer;

forming the second tier comprises forming second-tier source regions directly on an upper end of a respective second semiconductor channel;

forming the second tier comprises forming a source line over the second-tier source regions, wherein the source line is electrically shorted to the second-tier source regions;

forming the first tier comprises forming first source contact via structures through the first alternating stack and on the first-tier source regions; and forming the second tier comprises forming second source contact via structures through the second alternating stack in electrical contact with the first source contact via structures.

20. The method of claim 15, wherein each of first and second memory stack structures comprises, from outside to inside:

at least one blocking dielectric, a memory material layer, a tunneling dielectric, and one of a first semiconductor channel and a second semiconductor channel.

21. The method of claim 15, further comprising:

forming a third tier over the second tier, the third tier comprising a third alternating stack of third insulating layers and third electrically conductive layers, third memory stack structures extending through the third alternating stack and each including a third semiconductor channel, and third drain regions contacting an upper end of each third semiconductor channel; and forming a source line over the second tier.

22. The method of claim 21, wherein:

the third tier is formed over the source line; and the source line is electrically shorted to a subset of second-tier source regions contacting an upper end of a respective second semiconductor channel and to a subset of third source regions contacting a lower end of a respective third semiconductor channel.

23. The method of claim 15, further comprising:

forming an epitaxial pedestal in epitaxial alignment with a substrate semiconductor layer, wherein the epitaxial pedestal vertically extends above the substrate semiconductor layer; and forming peripheral semiconductor devices in a top portion of the epitaxial pedestal.

24. The method of claim 14, wherein the multi-tier memory device comprises a vertical NAND device located over the substrate.

25. The method of claim 24, wherein:

the first and second electrically conductive layers comprise, or are electrically connected to, a respective word line of the vertical NAND device;

the substrate comprises a silicon substrate;

the vertical NAND device comprises an array of monolithic three-dimensional NAND strings over the silicon substrate;

at least one memory cell in a first device level of the array of monolithic three-dimensional NAND strings is located over another memory cell in a second device level of the array of monolithic three-dimensional NAND strings; and the array of monolithic three-dimensional NAND strings comprises:
- a plurality of semiconductor channels including the first and second semiconductor channels, wherein at least one end portion of each of the plurality of semiconductor channels extends substantially perpendicular to a top surface of the substrate;
- a plurality of charge storage elements, each charge storage element located adjacent to a respective one of the plurality of semiconductor channels; and
- a plurality of control gate electrodes having a strip shape extending substantially parallel to the top surface of the substrate, the plurality of control gate electrodes comprise at least a first control gate electrode located in the first device level and a second control gate electrode located in the second device level.

26. The method of claim 14, wherein the multi-tier memory device comprises a resistive random access memory device in which the first and second electrically conductive layers are word lines for accessing a resistive memory element within a three-dimensional array of resistive memory elements.

\* \* \* \* \*